(12) United States Patent
Kobayashi

(10) Patent No.: US 8,076,838 B2
(45) Date of Patent: Dec. 13, 2011

(54) LIGHT EMITTING DEVICE

(75) Inventor: Hidekazu Kobayashi, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 278 days.

(21) Appl. No.: 12/253,465

(22) Filed: Oct. 17, 2008

(65) Prior Publication Data

US 2009/0108743 A1 Apr. 30, 2009

(30) Foreign Application Priority Data

Oct. 31, 2007 (JP) .................................. 2007-282891
Jul. 30, 2008 (JP) .................................. 2008-195855

(51) Int. Cl.
*H01J 1/63* (2006.01)

(52) U.S. Cl. ........ 313/504; 313/500; 313/501; 313/502; 313/503; 313/506

(58) Field of Classification Search .......... 313/495–512; 315/169.3, 169.4; 428/690, 917; 345/30, 345/36, 44, 45; 445/24–25
See application file for complete search history.

(56) References Cited

U.S. PATENT DOCUMENTS

| | | | |
|---|---|---|---|
| 2003/0067266 A1* | 4/2003 | Kim et al. ...................... | 313/504 |
| 2004/0017335 A1* | 1/2004 | Kobayashi et al. .............. | 345/82 |
| 2005/0006652 A1* | 1/2005 | Pai ................................. | 257/79 |
| 2005/0040756 A1* | 2/2005 | Winters et al. ................. | 313/504 |
| 2005/0225232 A1* | 10/2005 | Boroson et al. ................ | 313/504 |
| 2005/0236982 A1* | 10/2005 | Nakayama et al. ............ | 313/506 |
| 2005/0280364 A1* | 12/2005 | Omura et al. .................. | 313/506 |
| 2007/0015429 A1* | 1/2007 | Maeda et al. .................... | 445/24 |
| 2007/0114526 A1* | 5/2007 | Yokoyama et al. ............. | 257/40 |
| 2007/0236139 A1* | 10/2007 | Kobayashi et al. ........... | 313/504 |

FOREIGN PATENT DOCUMENTS

JP    A-09-127885    5/1997

* cited by examiner

*Primary Examiner* — Karabi Guharay
*Assistant Examiner* — Elmito Breval
(74) *Attorney, Agent, or Firm* — Oliff & Berridge, PLC

(57) ABSTRACT

A light emitting device includes a plurality of types of light emitting elements including at least a red light emitting element that outputs red light, a green light emitting element that outputs green light, and a blue light emitting element that outputs blue light. Each of the plurality of types of the light emitting elements includes a first electrode, a second electrode that is disposed on a side for outputting light and has semi-transmissive reflectivity or transparency, a function layer that is formed between the first electrode and the second electrode and includes at least a light emitting layer, a reflective layer that additionally serves as the first electrode or is formed separately from the first electrode in a position for facing the function layer through the first electrode and reflects light generated in the light emitting layer to the second electrode side, and a color filter that is disposed in a position for facing the reflective layer through the function layer and absorbs light having wavelengths in a wavelength range other than a wavelength range of the output light. In addition, at least one type of the light emitting element of the plurality of types of the light emitting elements further includes a semi-reflective layer that is disposed between the reflective layer and the function layer and a transparent layer that is disposed between the reflective layer and the semi-reflective layer.

8 Claims, 14 Drawing Sheets

LIGHT EMITTING DEVICE

BACKGROUND

1. Technical Field

The present invention relates to a light emitting device using an organic electroluminescence element as a light emitting element.

2. Related Art

Recently, as a light emitting device that is used in a display screen of a cellular phone, a personal computer, or the like, an organic EL device that forms an image by regularly arranging organic electroluminescence (hereinafter, referred to as organic EL) elements as light emitting elements on a display surface that is a surface on a side for outputting light has been considered.

Each light emitting element has a function layer that includes at least a light emitting layer (organic EL layer) between an anode and a cathode that are formed to face each other, and light is emitted by a current flowing between the anode and the cathode. The organic EL device forms an image by outputting the emitted light from the display surface. In addition, a configuration in which a reflective layer is disposed on a side opposite to the display surface and the emitted light is effectively used by reflecting light to the display surface side is generally used. To the above-described configuration, a configuration in which an electrode located on the display surface side is formed of a material having semi-transmissive reflectivity and light in a target wavelength range is enhanced and output by forming a microcavity structure between the reflective layer and the electrode is frequently added.

In the organic EL device having such a configuration, reflection of external light may be a problem. Since the reflective layer reflects not only the emitted light but also external light incident from the display surface, the reflected external light is mixed in the emitted light in a bright place, and thereby contrast may be degraded.

As means for decreasing reflection of external light, a configuration in which a circular polarizing plate is bonded to the display surface side has been proposed (see JP-A-9-127885). Under the configuration, output of the reflected light from the display surface is suppressed by using a property that the direction of rotation of light modulated by the circular polarizing plate is reversed by reflection, and thereby contrast is improved.

In addition, when the organic EL device is a color image display device, a configuration in which a color filter is used has been proposed. By disposing color filters that transmit light of a wavelength range of emitted light and absorb light having wavelengths out of the wavelength range to light emitting elements of a total of three types including a red light emitting element that emits red light, a green light emitting element that emits green light, and a blue light emitting element that emits blue light, reflection of external light having wavelengths out of the wavelength range of emitted light can be decreased.

However, there are following problems in the above-described techniques. First, in the technique using the circular polarizing plate, a component polarized in one direction of the emitted light is absorbed, and thus, the ratio of light output from the display surface becomes a half or less, and accordingly, luminance decreases. When a current flowing through the light emitting layer is increased so as to supplement the decrease in the luminance, power consumption increases, or the lifetime of the light emitting layer may be shortened.

In addition, in the technique using the color filters, external light having wavelengths within the wavelength range of the light emitted by the light emitting elements cannot be absorbed, and accordingly, the reflection of external light cannot be sufficiently decreased.

In addition, in any of the above-described techniques, the same reflection decreasing means is provided for all the light emitting elements of the three types, and the spectral luminous efficacy (degree of spectral luminous effect) is not considered. Accordingly, there is a problem that the decrease in reflection of external light may be insufficient depending on the types of the light emitting elements.

SUMMARY

An advantage of some aspects of the invention is that it provides a light emitting device using an organic electroluminescence element as a light emitting element. The invention may be implemented in the following forms or application examples.

Application Example 1

According to Application Example 1, there is provided a light emitting device comprising a plurality of types of light emitting elements including at least a red light emitting element that outputs red light, a green light emitting element that outputs green light, and a blue light emitting element that outputs blue light. Each of the plurality of types of the light emitting elements includes: a first electrode; a second electrode that is disposed on a side for outputting light and has semi-transmissive reflectivity or transparency; a function layer that is formed between the first electrode and the second electrode and includes at least a light emitting layer; a reflective layer that additionally serves as the first electrode or is formed separately from the first electrode in a position for facing the function layer through the first electrode and reflects light generated in the light emitting layer to the second electrode side; and a color filter that is disposed in a position for facing the reflective layer through the function layer and absorbs light having wavelengths in a wavelength range other than a wavelength range of the output light. In addition, at least one type of the light emitting element of the plurality of types of the light emitting elements further includes a semi-reflective layer that is disposed between the reflective layer and the function layer and a transparent layer that is disposed between the reflective layer and the semi-reflective layer.

Under such a configuration, the effect of a decrease in reflection of external light due to a laminated body of the transparent layer and the semi-reflective layer can be acquired in addition to the effect of a decrease in reflection of external light due to the color filter. Accordingly, the contrast of the light emitting device can be improved.

Application Example 2

According to Application Example 2, in the above-described light emitting device, the plurality of types of the light emitting elements is light emitting elements of three types including a red light emitting element, a blue light emitting element, and a blue light emitting element.

Under such a configuration, by forming the laminated body of the transparent layer and the semi-reflective layer in a selected light emitting element, particularly for which reflection of external light is high, of the light emitting elements of the three types, reflection of external light can be decreased.

Application Example 3

According to Application Example 3, in the above-described light emitting device, only the green light emitting element has the semi-reflective layer.

The green light emitting element tends to have high reflectivity of external light. Accordingly, under such a configuration, reflection of external light only in the green light emitting element can be decreased. Therefore, a balance between the power consumption and the contrast of the light emitting device can be improved.

Application Example 4

According to Application Example 4, in the above-described light emitting device, the light emitting elements of two types including the green light emitting element and the blue light emitting element have the semi-reflective layer, respectively.

The blue light emitting element tends to have high reflectivity of external light after the green light emitting element. Accordingly, under such a configuration, reflection of external light can be decreased further. Therefore, a balance between the power consumption and the contrast of the light emitting device can be improved further.

Application Example 5

According to Application Example 5, in the above-described light emitting device, the light emitting layer is an organic electroluminescence layer.

An organic electroluminescence material has high luminance efficiency. Accordingly, under such a configuration, a light emitting device having low power consumption and improved display quality can be acquired.

Application Example 6

According to Application Example 6, in the above-described light emitting device, the semi-reflective layer is formed of titanium.

A film layer formed of titanium can be configured to have an appropriate ratio of reflectivity to transparency. Accordingly, under such a configuration, reflection of external light can be decreased further. Therefore, a light emitting device having much improved contrast can be acquired.

Application Example 7

According to Application Example 7, in the above-described light emitting device, the semi-reflective layer is formed of one of chromium, tantalum, and molybdenum.

A film layer formed of these materials can be configured to have an appropriate ratio of reflectivity to transparency. Accordingly, under such a configuration, reflection of external light can be decreased further. Therefore, a light emitting device having much improved contrast can be acquired.

Application Example 8

According to Application Example 8, in the above-described light emitting device, the first electrode is an anode and the second electrode is a cathode.

Under such a configuration, extraction efficiency of light generated in the light emitting layer can be improved. Accordingly, the power consumption of the light emitting device can be decreased, and the display quality can be improved.

Application Example 9

According to Application Example 9, in the above-described light emitting device, the anode is formed of a transparent conductive material, and the transparent layer and the semi-reflective layer is formed between the reflective layer and the first electrode.

Under such a configuration, the layer thicknesses of the transparent layer and the anode can be set to appropriate values, and accordingly, the display quality of the light emitting device can be improved further.

Application Example 10

According to Application Example 10, in the above-described light emitting device, the transparent layer is formed of a conductive material and serves as the first electrode additionally.

Under such a configuration, by forming the semi-reflective layer on the function layer side of the first electrode, the laminated body of the transparent layer and the semi-reflective layer can be formed. Accordingly, the display quality of the light emitting device can be improved while an increase in the manufacturing cost is suppressed.

Application Example 11

According to Application Example 11, in the above-described light emitting device, the transparent layer includes a transparent insulating material layer that is disposed on the function layer side of the reflective layer and a transparent conductive material layer that is disposed on the function layer side of the transparent insulating material layer and serves as the first electrode additionally.

Under such a configuration, since the transparent insulating material layer can serve as a protection film for the reflective layer, the display quality and reliability of the light emitting device can be improved.

Application Example 12

According to Application Example 12, in the above-described light emitting device, the second electrode is an anode and the first electrode is a cathode.

Under such a configuration, the cathode can serve as the reflective layer additionally. Accordingly, the display quality of the light emitting device can be improved while an increase in the manufacturing cost is suppressed.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
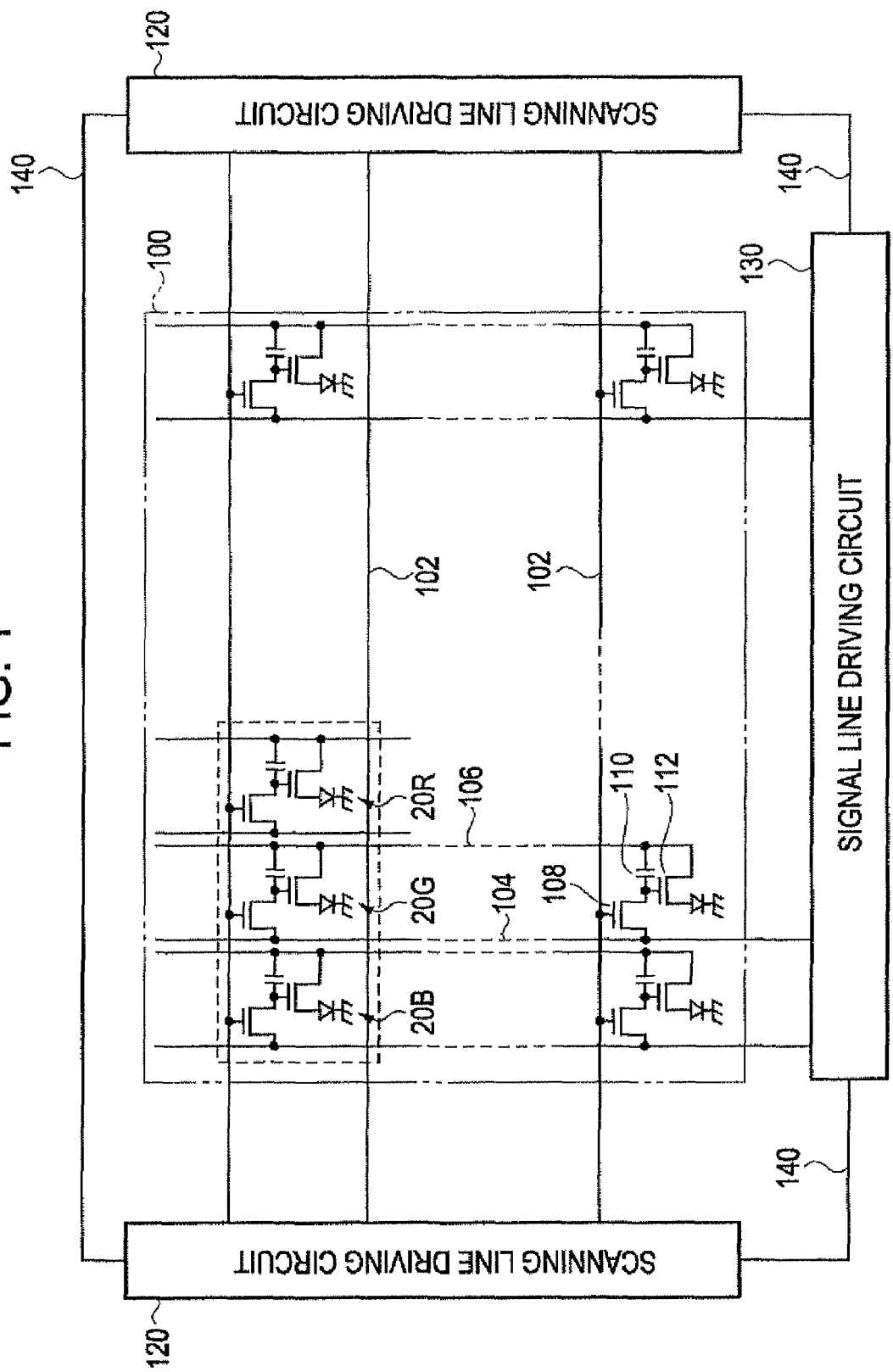
FIG. 1 is a circuit diagram showing the whole configuration of an organic EL device according to a first embodiment of the invention.

Hereinafter, organic EL devices according to embodiments of the present invention as light emitting elements that display an image by regularly disposing light emitting elements in a display area will be described. In drawings represented below, in order to represent constituent elements in sizes recognizable in the drawings, measures and scales of the constituent elements are appropriately changed.

First Embodiment

Organic EL Device

FIG. 1 is a circuit diagram showing the whole configuration of an organic EL device that is common to an organic EL device according to a first embodiment of the invention and organic EL devices according to other embodiments of the invention to be described later. As an example, an organic EL device of an active matrix type that forms an image in a display area 100 by individually controlling light emission of light emitting elements that are regularly disposed is shown. In the display area 100, a plurality of scanning lines 102, a plurality of signal lines 104 disposed perpendicular to the scanning lines 102, and a plurality of power supply lines 106 that extend parallel to the signal lines 104 are formed. A partition surrounded by the above-described wirings of three types is a pixel area.

In each pixel area, a switching TFT 108 having a gate electrode to which a scanning signal is supplied through the scanning line 102, a holding capacitor 110 that maintains a pixel signal supplied from the signal line 104 through the switching TFT 108, a driving TFT 112 having a gate electrode to which the pixel signal maintained by the holding capacitor 110 is supplied, and a light emitting element 20 in which a driving current flows from the power supply line 106 through the driving TFT 112 are formed. As the light emitting element 20, there are a total of three types including a blue light emitting element 20B that emits blue light, a green light emitting element 20G that emits green light, and a red light emitting element 20R that emits red light. To be described later, the light emitting element 20 forms between an anode 56 (see FIG. 2) as a first electrode and a cathode 55 (see FIG. 2) as a second electrode that is formed over the entire range of the display area 100 and has the entire range set to a common electric potential, and a function layer including a light emitting layer. The driving current is supplied to the anode 56.

In descriptions here, when an alphabet (R, G, or B) representing the color of emitted light is omitted, a collective term of the constituent elements of three types corresponding to the three colors is represented. For example, "a light emitting element 20" is a collective term of the light emitting elements of the above-described three types.

In the vicinity of the display area 100, scanning line driving circuits 120 and a signal line driving circuit 130 are formed. To the scanning lines 102, scanning signals are sequentially supplied from the scanning line driving circuits 120 in accordance with various signals supplied from an external circuit not shown in the figure. In addition, to the signal lines 104, image signals are supplied from the signal line driving circuit 130. To the power supply lines 106, pixel driving currents are supplied from an external circuit not shown in the figure. The operation of the scanning line driving circuits 120 and the operation of the signal line driving circuit 130 are synchronized in accordance with a synchronization signal that is supplied through a synchronization signal line 140 from an external circuit.

When the scanning line 102 is driven and the switching TFT 108 is turned on, the electric potential of the signal line 104 at that moment is maintained by the holding capacitor 110, and the level of the driving TFT 112 is determined based on the state of the holding capacitor 110. Then, a driving current flows in the anode 56 from the power supply line 106 through the driving TFT 112. In addition, the driving current flows in the cathode 55 through the above-described function layer (hereinafter, referred to as a light emission and function layer) including the light emitting layer. As a result, the light emitting layer emits light in accordance with the magnitude of the driving current. In the display area 100, the above-described light emitting elements 20 of the three types are regularly disposed. The light emitting elements 20 are independently controlled so as to emit light in accordance with the magnitudes of the driving currents, and whereby a color image is formed in the display area 100.

The disposition order of the light emitting elements 20 of the three types is not limited to the order of B, G, and R. Thus, for example, the light emitting elements may be disposed in order of R, B, and G. In addition, the shapes of the light emitting elements 20 of the three types in the plan view are not needed to be the same with one another.

Figure 2:
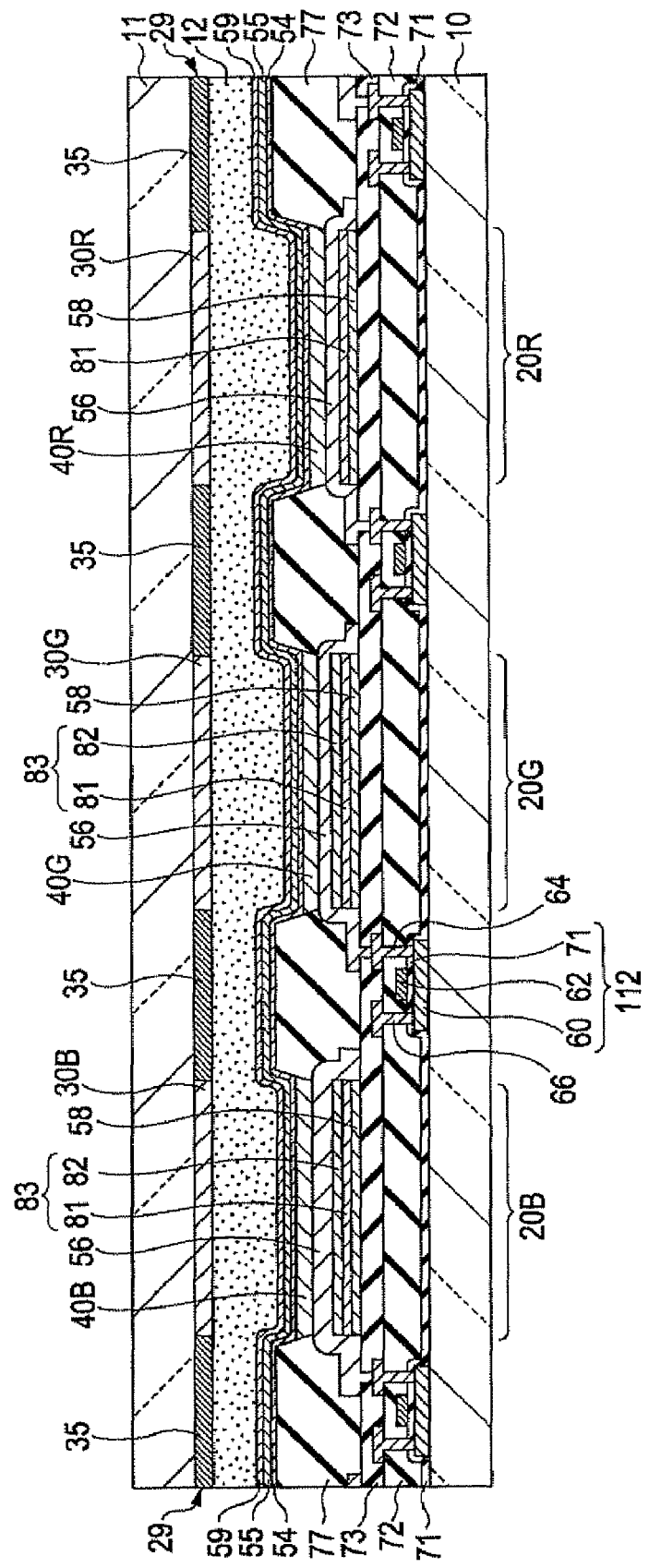
FIG. 2 is a schematic cross section view of the organic EL device according to the first embodiment.

FIG. 2 is a schematic diagram showing the cross-section of the organic EL device according to this embodiment. The organic EL device according to this embodiment is a top emission type EL device in which light is output to the opposing substrate 11 side. FIG. 2 shows the light emitting elements 20 of a total of three types including the blue light emitting element 20B, the green light emitting element 20G, and the red light emitting element 20R that are regularly disposed on a face, which is located on the opposing substrate 11 side, of the component substrate 10 together with driving TFTs 112 that drive the light emitting elements 20. The switching TFT 108 (see FIG. 1) and the like are not shown in the figure.

The component substrate 10 is bonded to the opposing substrate 11 formed of a transparent material through an adhesive layer 12. On one side of the opposing substrate 11, a color filter layer 29 is formed, and the opposing substrate is bonded such that the color filter layer is disposed to face the component substrate 10. The color filter layer 29 is formed of color filters 30 of a total of three types including a red color filter 30R, a green color filter 300, and a blue color filter 303 that are regularly disposed and black matrices 35 that partition the color filters 30. The blue color filter 30B is bonded to face the blue light emitting element 20B. In addition, the green color filter 30G is bonded to face the green light emitting element 20G, and red color filter 30R is bonded to face the red light emitting element 20R. The color filters 30 performs a function for improving chromatic purity of light emitted by the light emitting elements 20 and a function for decreasing reflection of external light. These functions will be described later.

The light emitting element 20 includes, in an area in which the light emission and function layer 40 (in particular, the light emitting layer included in the light emission and function layer) emits light in a conductive state, that is, the area surrounded by a partition wall 77, the anode 56, the cathode 55, and each layer formed between one pair of the electrodes and a reflective layer 58, an optical interference structure 83 formed of a semi-reflective layer 82 and a transparent layer 81, and the like that will be described later.

On a face, which is located on the opposing substrate side 11, of the component substrate 10, a driving TFT 112 configured by a channel region 60 that is formed of a poly silicon (multicrystalline silicon) layer, a gate insulating layer 71 that is formed of silicon oxynitride or the like, and a gate electrode 62 that is formed of polysilicon, Al (aluminum), or the like is formed. In addition, on the opposing substrate 11 side of the TFT 112, a first interlayer insulating layer 72 that covers the driving TFT and is formed of silicon oxynitride or the like is formed. A part of the first interlayer insulating layer 72 that is overlapped with the channel region 60 in a plan view is selectively removed so as to form a contact hole. In addition, a drain electrode 64 and a source electrode 66 that are in a conductive state with the channel region 60 are formed to fill in the contact hole.

On the opposing substrate 11 side of the drain electrode 64 and the source electrode 66, a second interlayer insulating layer 73 that is formed of silicon oxynitride or the like is formed. In addition, a contact hole is formed by selectively removing a part of the second interlayer insulating layer that is overlapped with the drain electrode 64 in a plan view.

On the opposing substrate 11 side of the second interlayer insulating layer 73, an anode 56 as a first electrode is formed through the reflective layer 58, the transparent layer 81 to be described later, and the like. The anode 56 is formed by patterning a thin film of ITO (Indium Tin Oxide) that is transparent and conductive material and is electrically connected to the drain electrode 64 through the contact hole. Accordingly, the anode 56 is in a conductive state with the driving TFT 112 and can supply the driving current supplied from the power supply line 106 to the light emission and function layer 40 to be described later. The layer thickness of the anode 56 is about 124 nm in the blue light emitting element 20B, about 22 nm in the green light emitting element 20G, and about 92 nm in the red light emitting element 20R.

As a forming material of the anode 56, other than the above-described ITO, a known transparent conductive material such as indium zinc oxide may be used. In addition, the layer thickness of the anode 56 is not limited to the above-described values. Thus, it is preferable that the layer thickness of the anode 56 is set to a value appropriate for adjusting the optical path length (the resonant length) of a microcavity structure 88 (see FIG. 3) to be described later. The forming material and layer thickness of the reflective layer 58 is common to the light emitting elements and is formed of an Al layer having a layer thickness of about 100 nm.

On the opposing substrate 11 side of the second interlayer insulating layer 73 and the anode 56, the partition wall 77 is formed by patterning an organic or inorganic insulating material layer such as a polyimide layer. The patterning process is performed so as to expose an area overlapped with the reflective layer 58 of the anode 56. In addition, in the above-described area located on the opposing substrate 11 side of the anode 56, the light emission and function layer 40 corresponding to the light emitting elements 20 is formed. In particular, in the above-described area of the blue light emitting element 20B, a blue light emission and function layer 40B is formed. In addition, a green light emission and function layer 40G is formed in the above-described area of the green light emitting element 20G, and a red light emission and function layer 40R is formed in the above-described area of the red light emitting element 20R. The forming material and the like of the light emission and function layers 40 will be described later.

On the opposing substrate 11 side of the light emission and function layers 40 and the partition wall 77, an electron injecting layer 54, a cathode 55 as a second electrode, and a sealing layer 59 are formed in the described order The electron injecting layer 54 is formed of LiF (lithium fluoride) having a layer thickness of about 1 nm and improves the luminous efficiency by increasing the efficiency of electron injection from the cathode 55. As the forming material of the cathode 55, it is preferable that metal having a work function equal to or smaller than 4.2 eV, alkaline metal having a work function equal to or smaller than 3.5 eV, or an alkaline earth metal is used. In this embodiment, MgAg (magnesium-silver alloy) is used. The layer thickness of the cathode 55 is about 10 nm. The cathode 55 has a semi-transmissive reflectivity, that is, a property of transmitting about 50% of irradiated light by reflecting about 50% of the light. As the forming material of the sealing layer 59, a transparent material having a high gas barrier property is preferably used. In this embodiment, the sealing layer 59 of the organic EL device is formed of silicon oxynitride (SiOxNy) having a layer thickness of about 200 nm.

Each of the above-described layers is formed to cover at least the entire face of the display area 100 (see FIG. 1). The cathode 55 is grounded in an area outside the display area 100. The component substrate 10 on which the sealing layer 59 has been formed and the opposing substrate 11 on which the color filter layer 29 has been formed are bonded together through the adhesive layer 12 such that the sealing layer and the color filter are disposed to face each other for forming the organic EL device. Although there is a case where a light emission and function layer including the electron injecting layer 54 is referred to as the light emission and function layer 40, in descriptions here, the election injecting layer 54 and the light emission and function layer 40 are described as separate layers.

As described above, in areas of a face of the second interlayer insulating layer 73 on the opposing substrate 11 side which is overlapped with the light emission and function layers 40 of the light emitting elements 20 in a plan view, reflective layers 58 are formed. As described above, the anode 56 is formed of a transparent conductive material. Thus, light toward the component substrate 10 side of the light generated in the light emission and function layer 40 reaches the reflective layer 58 through the anode 56 and then is reflected from the opposing substrate 11 side. In addition, since the cathode 55 is formed of a semi-transmissive reflectivity material, about 50% of light toward the opposing substrate 11 side of the light generated in the light emission and function layer 40 is reflected from the cathode 55 on the component substrate 10 side. As a result, between the cathode 55 and the reflective layer 58, a microcavity structure 88 (see FIG. 3) is formed.

In addition, on the opposing substrate 11 side of the reflective layer 58 of the blue light emitting element 20B and the green light emitting element 20G, the transparent layer 81 and the semi-reflective layer 82 are formed in the described order, and an optical optical interference structure 83 is formed by the thin films of the two layers. Regarding the forming materials of the two layers, the transparent layer 81 is formed of SiN (silicon nitride) having a layer thickness of about 85 nm, and the semi-reflective layer 82 is formed of titanium having a layer thickness of about 20 nm. In addition, on the opposing substrate 11 side of the reflective layer 58 of the red light emitting element 20R, only the transparent layer 81 is formed, and thus, the optical optical interference structure 83 is not formed. According to the organic EL device of this embodiment, external light reflection decreases by using functions of the optical interference structure 83, the microcavity structure 88, and the color filter 30. The above-described aspects will be described with reference to FIGS. 3 and 4.

Figure 3:
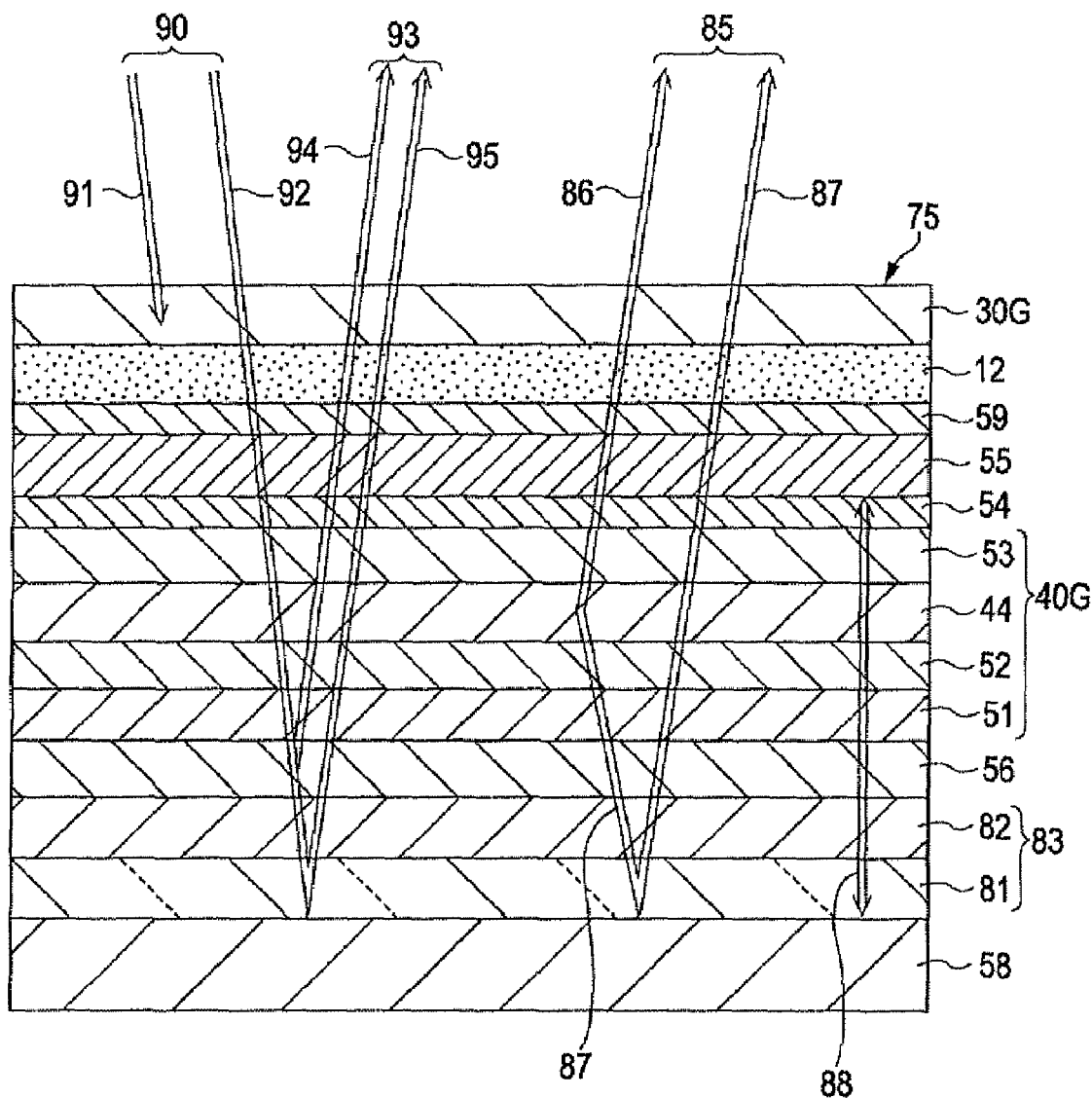
FIG. 3 is a schematic cross-sectional view of a green light emitting element according to an embodiment of the invention.

FIG. 3 is a schematic cross-sectional view showing the green light emitting element 20G, that is, the cathode 55, the anode 56, layers interposed between one pair of the electrodes together with the green color filter 30G, the above-described optical interference structure 83, and the like. In the figure, each layer constituting the green light emission and function layer 40G of the green light emitting element 20G shown in FIG. 2 are shown, and a reference numeral for a display surface 75 is added.

The display surface 75 is a surface of the green light emitting element 20G and is a surface from which display light, that is, the light emitted from the inside of the green light emission and function layer 40G is output toward an observer through the green color filter 30G. In the figure, the opposing substrate 11 is not shown, and a boundary surface between the green color filter 300 and the component substrate 10 is schematically shown as the display surface 75.

The green light emission and function layer 40G is configured by a total of four layers including the hole injecting layer 51, the hole transporting layer 52, the green light emitting layer 44, and the electron transporting layer 53 that are formed on the opposing substrate 11 side of the anode 56 in the described order. The layer thickness of the green light emission and function layer 40G, that is, the total layer thickness of the above-described four layers is about 94 nm.

The hole injecting layer 51 improves the luminous efficiency by increasing the efficiency of hole injection from the anode 56. In addition, the hole transporting layer 52 and the electron transporting layer 53 improve the luminous efficiency by increasing the hole transportability and the electron transportability for the green light emitting layer 44. As the forming materials of the layers, HI406 (manufactured by Idemitsu Kosan Co., Ltd.) is used for the hole injecting layer 51. In addition, HT320 (manufactured by Idemitsu Kosan Co., Ltd.) is used for the hole transporting layer 52, and Alq3 (aluminum quinolinol) is used for the electron transporting layer 53.

The light emitting layer (the green light emitting layer 44 or the like) is formed by mixing a dopant having a light emitting function by combining electrons and holes in a host material that secures conductivity. The green light emitting layer 44 is formed by mixing quinacridone as a dopant in BH215 (manufactured by Idemitsu Kosan Co., Ltd.) as the host material.

In the organic EL device according to this embodiment and organic EL devices according to other embodiments and comparative examples to be described later, both layer thicknesses of the blue light emission and function layer 40B of the blue light emitting element 20B and the red light emission and function layer 40R of the red light emitting element 20R are about 94 nm that is the same as the layer thickness of the green light emission and function layer 40G, and the forming materials are the same except for the dopant of the light emitting layer. The forming material of the light emission and function layer 40 is not limited to the above-described materials. Thus, a known material of a low molecular system or a high molecular system that contributes to light emission may be used.

As described above, the object of the organic EL device according to this embodiment is to decrease the external light reflectivity, that is, the ratio of light that is reflected from the reflective layer 58 and output from the display surface 75 to the external light incident to the display surface 75 as possibly as can be, with an increase in power consumption suppressed. Accordingly, the optical interference structures 83 are additionally formed on the reflective layer 58 of the blue light emitting element 20B and the green light emitting element 20G by using the color filters 30 while light emission of any one of three primary colors are generated by using different dopants for each light emitting element 20.

The external light 90 is white light and includes light having a broad range of wavelengths. In addition, the green color filter 30G has a function for transmitting light (that is, a green light component) in the range of wavelengths having a predetermined width having about 540 nm as its center of the incident light and absorbing light (a none green light component) other than the light in the range of wavelengths of the predetermined width. Accordingly, of the light included in the external light 90 incident to the display surface 75, the green light component (hereinafter, referred to as a second external component 92) passes through the green color filter 30G, and the non-green light component (hereinafter referred to as a first external light component 91) is absorbed by the green color filter 30G and is dissipated as heat. As a result, the light (the amount of light) incident to the green light emitting element 20G is decreased markedly by the green color filter 30G.

Then, the second external light component 92 incident to the green light emitting element 20G passes through the green light emission and function layer 40G and the like and reaches the optical interference structure 83 configured by the transparent layer 81 and the semi-reflective layer 82. Here, since the cathode 55 has the semi-transmissive reflectivity, a part of the second external light component 92 is reflected to be output from the display surface 75. However, a description of the output light is omitted here.

All the layers included from the boundary surface between the cathode 55 and the electron injecting layer 54 to the boundary surface between the anode 56 and the semi-reflective layer 82 have transparency. Thus, most of the second external light component 92 reaches the boundary surface between the anode 56 and the semi-reflective layer 82 without attenuation. Then, about 50% of the light is reflected from the boundary surface between the anode 56 and the semi-reflective layer 82 to be first reflection light 94, and the remaining about 50% of the light passing through the surface goes through the optical interference structure 83 and then, is reflected from the surface of the reflective layer 58 to be second reflection light 95. Then, light composed of the first reflection light 94 and the second reflection light 95 is output from the display surface 75 as reflection light 93. Here, a total of the optical distance (acquired from multiplying a layer thickness by an index of refraction) of the transparent layer 81 and the optical distance of the semi-reflective layer 82 is set to be a quarter of the wavelength of the second external light component 92. Accordingly, the second reflection light 95 and the first reflection light 94 have phases deviated from each other by a half of the wavelength, that is, 180 degrees. As a result, the first reflection light 94 and the second reflection light 95 are offset, and accordingly, the light amount of the reflection light 93 decreases markedly, compared to that of the second external light component 92.

Next, light emission generated by the light emission and function layer 40 will be described. About 50% of light generated by the green light emitting layer 44 included in the green light emission and function layer 40G progresses towards the opposing substrate 11 side, and the remaining about 50% of the generated light progresses toward the component substrate 10 side (in the figure, the reflective layer 58 side). Hereinafter, the light progressing toward the opposing substrate 11 side is referred to as first emission light 86. In addition, the light that progresses toward the component substrate 10 side and then, is reflected from the reflective layer 58 toward the opposing substrate 11 side is referred to as second emission light 87. Accordingly, light composed of the first emission light 86 and the second emission light 87 becomes the output light (display light) 85. The output light 85 decreases in the wavelength range by being transmitted through the green color filter 30G, the chromatic purity of the output light 85 is improved, and then, the output light is output from the display surface 75.

Here, since the second emission light 87 is transmitted through the optical interference structure 83, a component reflected from the boundary surface between the anode 56 and the half-reflective layer 82 and a component passing through the boundary surface are offset, and accordingly, the intensity (the light amount) decreases slightly. However, the first emission light 86 is output not through the optical interference structure 83. Accordingly, the output light 85 is not influenced too much by the optical interference structure 83 on the whole, and the decrease in the intensity (the light amount) is limited.

The forming position of the optical interference structure 83 is between the cathode 55 and the reflective layer 58. Thus, the optical interference structure 83 may be formed between the light emission and function layer 40 and the cathode 55. However, when the optical interference structure 83 is formed in the above-described position, the influence on the output light (display light) 85 becomes large. In the organic EL device according to this embodiment, by forming the optical interference structure 83 in a position in which all the second external light component 92 is irradiated and only about 50% of the output light 85 is irradiated, that is, a position between the reflective layer 58 and the light emission and function layer 40, reflection of the external light decreases with a decrease in the extraction efficiency suppressed.

In addition, the layer thicknesses of the transparent layer 81 and the semi-reflective layer 82 are not fixed to the above-described values. The reflectivity of the external light changes markedly in accordance with setting of the above-described layer thicknesses, and accordingly, it is preferable to set the layer thicknesses such that the reflectivity of light having a peak wavelength can decrease in accordance with the peak wavelength of the external light passing though the color filter layer 29 of each light emitting element 20 to reach the anode 56. It is preferable that the layer thickness of the transparent layer 81 is set in the range of about 50 nm to 200 nm. In addition, it is preferable to set the layer thickness of the semi-reflective layer 82 in the range of about 5 nm to 30 nm in consideration of a change in transparency.

Next, the microcavity structure 88 will be described. Since the cathode 55 is formed of a material having semi-transmissive reflectivity, about 50% of light generated by the green light emitting layer 44 is reflected from the cathode 55 to the reflective layer 58 side. Accordingly, the microcavity structure 88 is formed between the cathode 55 and the reflective layer 58. When the resonant length (an optical distance between the cathode 55 and the reflective layer 58) of the microcavity structure 88 has an appropriate value, the emission light generates multiple interference inside the microcavity structure 88. Thus, after the chromatic purity of the emission light is improved, the emission light is output from the display surface 75. Since the improvement of the chromatic purity can supplement the function of the green color filter 30G, the extraction efficiency is improved. As a result, power consumption for the same luminance can decrease.

In order to maximize the effect of improvement of the chromatic purity due to multiple interference, it is needed that the optical distance L satisfies Equation (1).

$$m\lambda_1 = 2L + (\phi_2 + \phi_1)$$ Equation (1)

In addition, the microcavity structure 88 can perform a function for decreasing reflection of the external light by offsetting the second external light component (the green light component) 92 using interference. In order to maximize the effect of a decrease in the reflection of the external light by using the interference, it is needed for the optical distance L to satisfy Equation (2).

$$(m+1/2)\lambda_2 = 2L + (\phi'_2 - \phi'_1)$$ Equation (2)

Here, M denotes an integer equal to or larger than one, and L denotes an optical distance between the boundary surface between the cathode 55 and the electron injecting layer 54 and the boundary surface between the reflective layer 58 and the transparent layer 81. In addition, $\lambda_1$ denotes a peak wavelength of light desired to be output from the display surface 75, and $\lambda_2$ denotes a peak wavelength of light for which reflection is desired to decrease. In addition, $\phi_1$ denotes a phase difference of light having a wavelength of $\lambda_1$ for a case where the light is reflected from the reflective layer 58, and $\phi_2$ denotes a phase difference of light having a wavelength of $\lambda_1$ for a case the light is reflected from the cathode 55. In addition, $\phi'_1$ denotes a phase difference of light having a wavelength of $\lambda_2$ for a case the light is reflected from the reflective layer 58, and $\phi'_2$ denotes a phase difference of light having a wavelength of $\lambda_2$ for a case where the light is reflected from the cathode 55.

The peak wavelength of light desired for the green light emitting element 20G to output from the display surface 75 is naturally a peak wavelength of green light. In addition, the external light 90 becomes the second external light component (the green light component) 92 by being transmitted through the green color filter 30G. Accordingly, the peak wavelength of light for which reflection is desired to decrease by using the microcavity structure 88 is a peak wavelength of green light. Thus, $\lambda_1$ and $\lambda_2$ have approximate same values. In addition, the phase changes due to reflection cannot have very large values. As a result, it is difficult to set L to a value for satisfying both Equations (1) and (2).

In the organic EL device according to this embodiment, the resonant length is set such that the conflicting desires can be satisfied as possibly as can be. Thus, the chromatic purity is improved while decreasing the reflection of the external light, and accordingly, the power consumption for display with a same luminance level can decrease. As described above, the organic EL device according to this embodiment does not use a polarizing plate and the like, and the color filter scarcely absorbs light having a wavelength in the range to be output. Accordingly, there is the extraction efficiency to spare Therefore, the resonant length of the microcavity structure 88 can be set with the decrease in reflection of the external light focused while improvement of the chromatic purity considered.

The blue light emitting element 20B has a same configuration as that of the green light emitting element 20G except for two aspects including that the color filter is a blue color filter 30B for transmitting light (that is, a blue light component), which is in the range of wavelengths of a predetermined width having about 440 nm as its center, of light (external light) incident to the display surface 75 and absorbing light (a non-blue light component) other than the light in the range of wavelengths of the predetermined width, and that as the dopant of the light emitting layer included in the blue light emission and function layer 40B, BD052 (manufactured by Idemitsu Kosan Co., Ltd.) is used.

Figure 4:
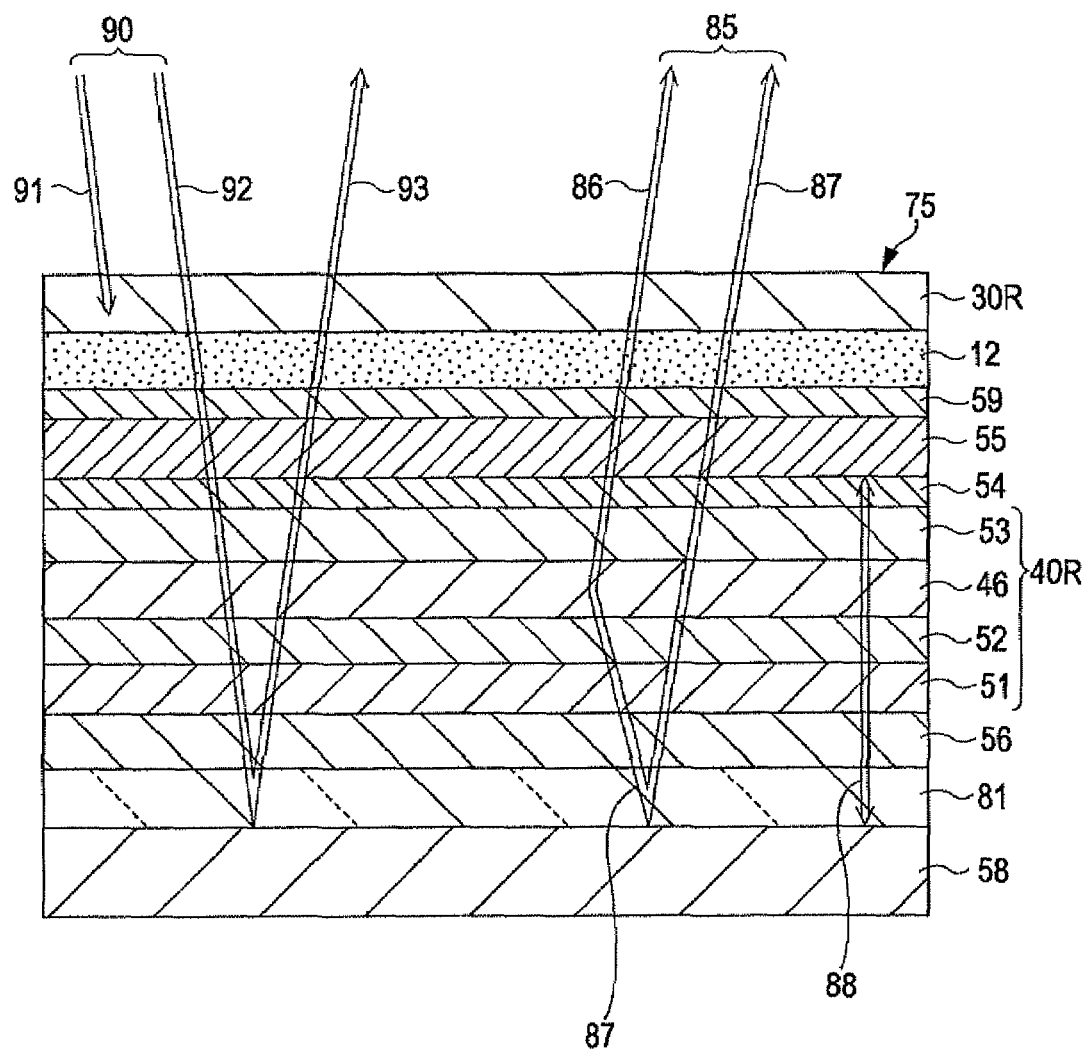
FIG. 4 is a schematic cross-sectional view of a red light emitting element according to an embodiment of the invention.

Next, the red light emitting element 20R of the organic EL device according to this embodiment will be described. FIG. 4 is a schematic cross-sectional view showing layers constituting the red light emitting element 20R together with the red color filter 30R and the like. In the red light emitting element 20R, only the transparent layer 81 is formed between the anode 56 and the reflective layer 58, and the semi-reflective layer 82 (see FIG. 3) is not formed, which is quite different from the green light emitting element 20G and the blue light emitting element 20B. Accordingly, the optical interference structure 83 (see FIG. 3) is not formed. In addition, the color filter 30 is different from those of the green light emitting element 20G and the blue light emitting element 20B that the color filter is a red color filter 30R for transmitting light (that is, a red light component), which is in the range of wavelengths of a predetermined width having about 650 nm as its center, of light incident to the display surface 75 and absorbing light (a non-red light component) other than the light in the range of wavelengths of the predetermined width, and that, as the dopant of the red light emitting layer 46 included in the red light emission and function layer 40R, RD001 (manufactured by Idemitsu Kosan Co., Ltd.) is used. The constituent elements except for the above-described differences are the same as those of the green light emitting element 20G shown in FIG. 3. Thus, to each common constituent element, a same reference sign is assigned, and a description thereof is omitted here.

Since the red light emitting element 20R does not have the optical interference structure 83, reflection of the external light is decreased by the red color filter 30R and the microcavity structure 88. The reason that there are differences between configurations of the light emitting elements 20 of three types configuring the organic EL device is in consideration of differences of reflectivities of the external light among the light emitting elements 20.

Figure 5:
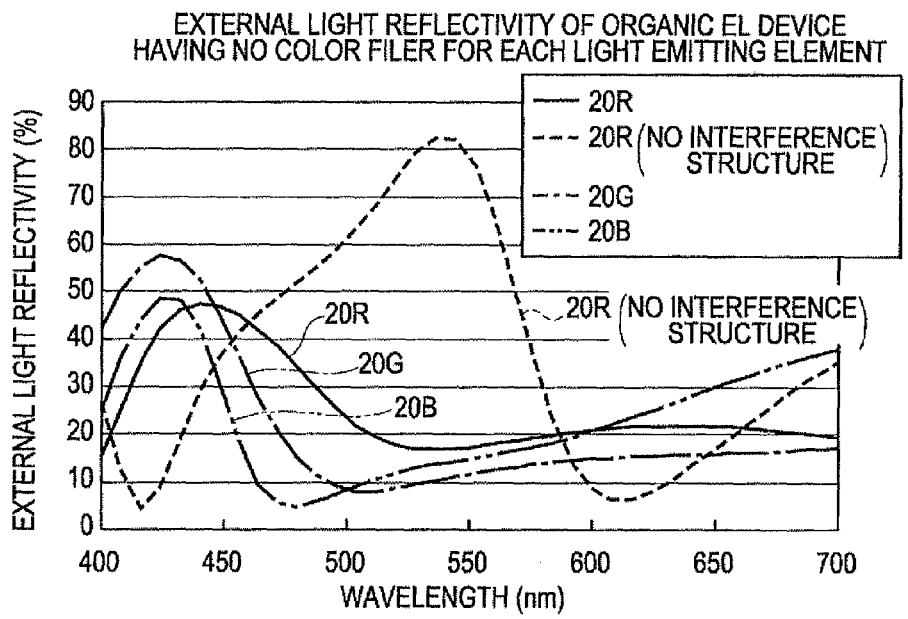
FIG. 5 is a diagram showing external light reflectivities of an organic EL device not having a color filter for each light emitting element.
Figure 6:
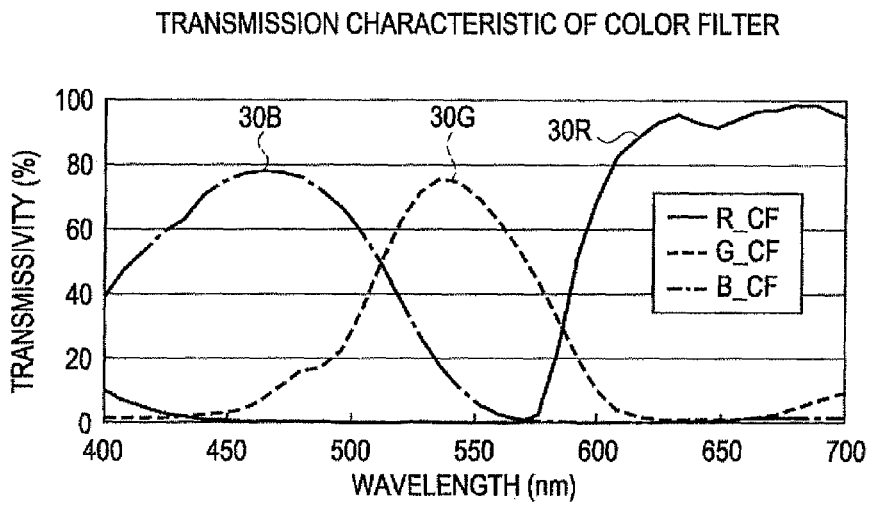
FIG. 6 is a diagram showing transmission characteristics of color filters according to an embodiment of the invention.
Figure 7:
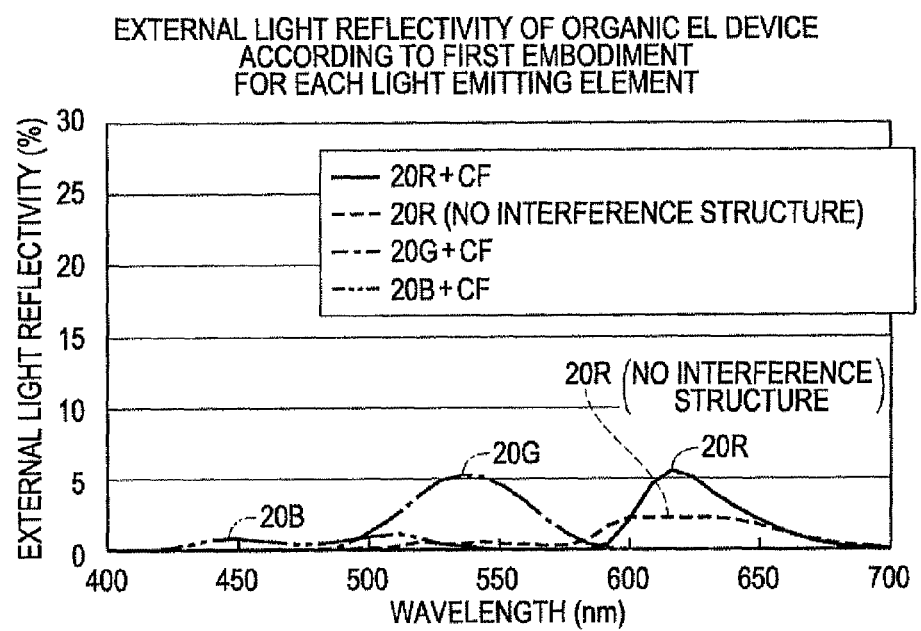
FIG. 7 is a diagram showing external light reflectivities of light emitting elements of the organic EL device according to the first embodiment.

As shown in FIGS. 5 to 7 to be described later, when the optical interference structure 83 is formed between the anode 56 and the reflective layer 58 of the red light emitting element 20R, the red color filter 30R has a little effect on decreasing the reflectivity of the external light having long wavelengths (light having a wavelength range of about 600 nm to 660 nm), and thereby contributing not much to decreasing the reflection of the external light. Accordingly, in the organic EL device according to this embodiment, the configurations of the light emitting elements of three types are configured not the same, and the decrease in the reflectivity of the external light and the decrease in the power consumption are implemented together on the whole at a high level by combining the effect of the color filter 30 and the like.

In particular, the color filters 30 are disposed for all the light emitting elements 20 of three types, and reflection of the external light is decreased by the color filters as possibly as can be. In addition, the resonant length of the microcavity structure 88 is set with a decrease in reflection of the external light focused. In addition, for the light emitting element 20 for which reflection of the external light cannot be sufficiently decreased by the above-described two units, the optical interference structure 83 is formed between the light emission and function layer 40 and the reflective layer 58. Accordingly, reflection of the external light additionally decreases without affecting the extraction efficiency as possibly as can be, and thus, the display quality of the whole organic EL device in a bright place is improved.

The effect of decreasing reflection of external light in the organic EL device according to this embodiment will be described with reference to FIGS. 5 to 7. FIG. 5 is a diagram showing reflectivities of external light of the organic EL device not having the color filter 30 for each light emitting element 20. The diagram shows a relationship between the reflectivity of external light and the wavelength for a case where the optical interference structures 83 are formed for the light emitting elements 20 of three types. For the red light emitting element 20R, the reflectivity of the external light for a case where the optical interference structure 83 is not included is additionally shown.

The external light reflectivities of the blue light emitting element 20B and the green light emitting element 20G decrease quite much for light having the wavelength range of about 500 nm to 550 nm. However, the reflectivity of the red light emitting element 20R does not decrease much for the light having the above-described wavelength range. Although the red light emitting element 20R not having the optical interference structure 83 has a high external light reflectivity for light, which is in the range of wavelengths equal to or longer than 650 nm, included in the wavelength range of the output light, the red light emitting light element 20R scarcely have spectral luminous efficacy for light having a wavelength equal to or longer than 700 nm, and thereby reflection of external light is not needed to be considered.

FIG. 6 is a diagram showing transmission characteristics of the color filters 30 used in the organic EL device according to this embodiment. From the diagram, It can be found that light having a wavelength deviated from the wavelength range of light desired to be output from the light emitting elements 20 scarcely passes through the color filters. Accordingly, the effect of decreasing the external light reflectivity for the deviated light is quite much.

FIG. 7 is a diagram showing external light reflectivities for the light emitting elements 20 (of three types) configuring the organic EL device according to the first embodiment. For the reflectivities, correction for the spectral luminous efficacy is performed. In the figure, the effect of decreasing the external light reflectivity by combining the color filters (CF) 30 and the optical interference structure 83 is shown. For the red light emitting element 20R, the result of measurement for the light emitting element 20 having the optical interference structure 83 for comparison is shown together with the result of measurement for the light emitting element 20, which does not have the optical interference structure 83, according to this embodiment. In addition, the result of Comparative Example 3 written in Table 1 to be described later is the result of measurement for a case where the red light emitting element 20R of the organic EL device according to the first embodiment is replaced with the above-described light emitting element 20 having the optical interference structure 83.

The external light reflectivity of the red light emitting element 20R not having the optical interference structure 83 is lower than that of red light emitting element 20R having the optical interference structure 83. As shown in FIG. 5, for light having a wavelength equal to or longer than 600 nm, the light reflectivity of the red light emitting element 20R not having the optical interference structure 83 is lower than that of the red light emitting element 20R having the optical interference structure. In addition, incidence of light having a wavelength equal to or shorter than 600 nm inside the light emitting element 20 is decreased by the red color filter 30R. Accordingly, the result is as shown in the figure. Although the external light reflectivity of the green light emitting element 20G is relatively high, the external light reflectivities of the remaining two light emitting elements are good on the whole. As a result, the organic EL device having the power consumption and the reflectivity of external light that are balanced with each other on the whole can be acquired.

Comparative Example

Figure 8:
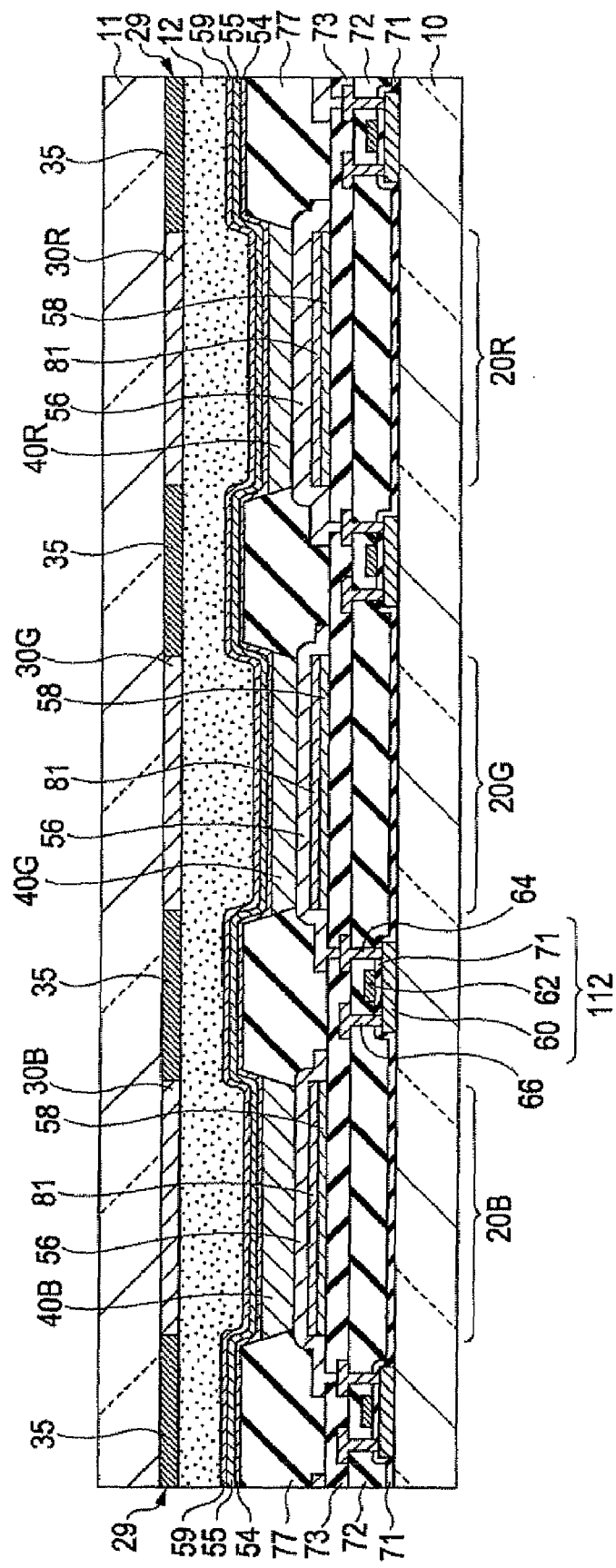
FIG. 8 is a schematic cross-sectional view showing an organic EL device as a comparative example.
Figure 9:
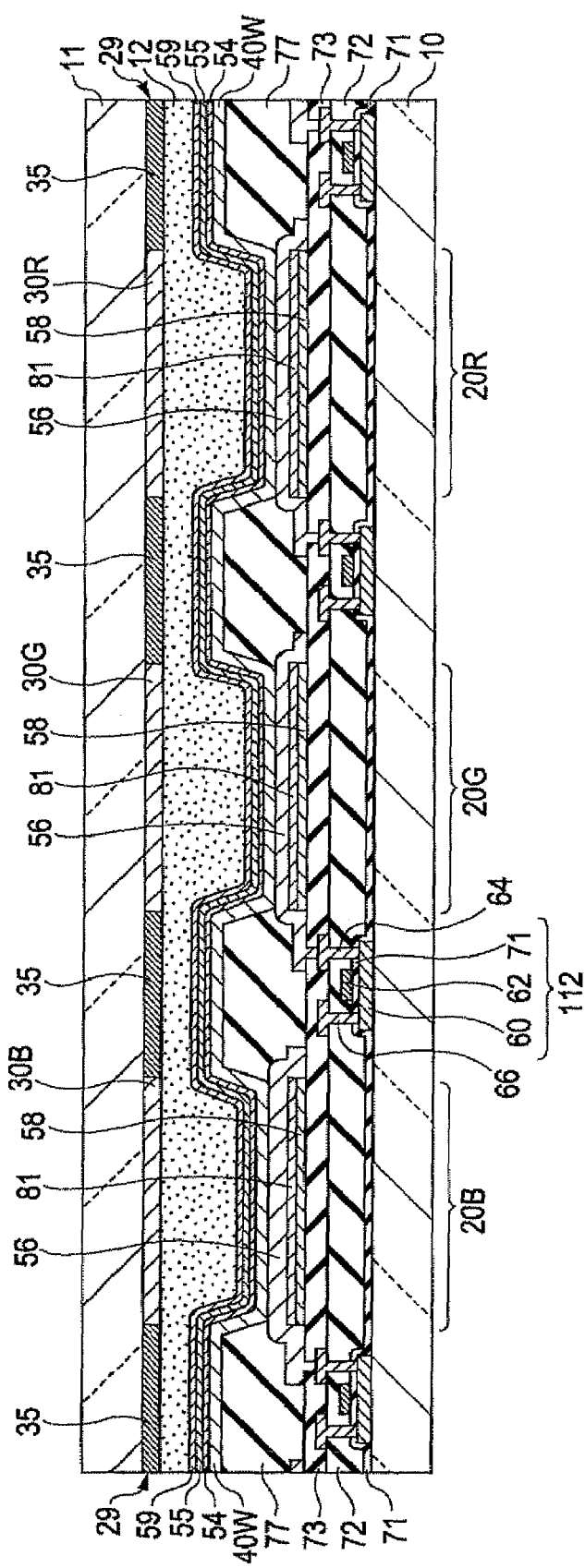
FIG. 9 is a schematic cross-sectional view showing an organic EL device as a comparative example.

FIGS. 8 and 9 are schematic sectional views showing an organic EL device according to Comparative Example 1 in which the semi-reflective layer 82 is not included and the optical interference structure 83 is not formed in all the light emitting elements 20 of three types. The basic configuration of the organic EL device is the same as the organic EL device according to the first embodiment shown in FIG. 2, except for the configuration of the light emission and function layer 40 and inclusion of the semi-reflective layer 82. Thus, to each common constituent element, a same reference sign is assigned. In the organic EL device shown in FIG. 8, as in the organic EL device according to the first embodiment shown in FIG. 2, a total of three types of light emitting elements including a blue light emitting element 20B, a green light emitting element 20G, and a red light emitting element 20R have different light emission and function layers 40.

The organic EL device shown in FIG. 9, differently from the organic EL device according to the first embodiment shown in FIG. 2, a white light emission and function layer 40W that is common to the light emitting elements 20 of three types is provided. The configuration of the white light emission and function layer 40W is the same as that of the above-described green light emission and function layer 40G, except that a light emitting layer acquired from laminating a total of three layers including a layer using BD052 as a dopant, a layer using quinacridone as a dopant, and a layer using RD001 as a dopant is included.

In both the organic EL devices, a resonant length, as is the same in the organic EL device according to the first embodiment, is set in consideration of both improvement of the extraction efficiency and a decrease in reflection of external light. The layer thickness of the light emission and function layer 40 is about 94 nm that is common to the light emitting elements 20 of three types. The transparent layer 81 is formed of silicon nitride, and the layer thickness of the transparent layer 81 is about 90 nm that is common to the light emitting elements 20 of three types. The anode 56 is formed of ITO, and the layer thickness of the anode 56 is about 27 nm in the blue light emitting element 20B, about 43.2 nm in the green light emitting element 20G, and about 86.2 nm in the red light emitting element 20R.

Figure 10:
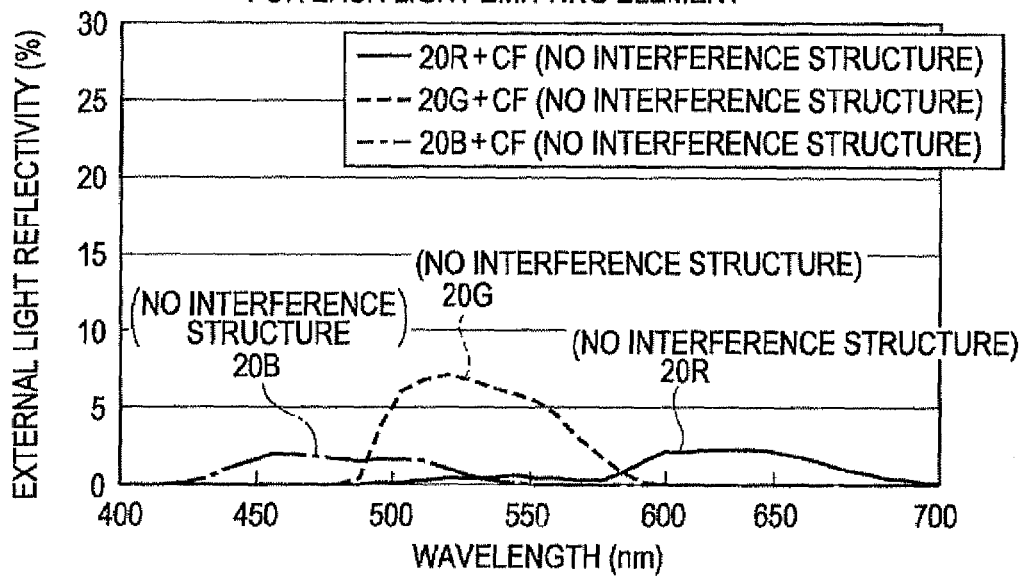
FIG. 10 is a diagram showing external light reflectivities of light emitting elements of an organic EL device according to Comparative Example 1.

FIG. 10 is a diagram showing the external light reflectivities of the light emitting elements 20 configuring the organic EL device according to Comparative Example 1 shown in FIGS. 8 and 9. Although the configuration of the light emission and function layer 40 is changed, the organic EL device according to Comparative Example 1 has approximately the same reflectivity of external light and power consumption, and thus, the reflectivity and the power consumption can be drawn in one drawing. The external light reflectivity of the red light emitting element 20R is the same as that of the first embodiment. In addition, although the external light reflectivity of the blue light emitting element 20B slightly increases, it is in an allowable level. However, the external light reflectivity of the green light emitting element 20G represents a high value, compared to other light emitting elements, and it represents that the decrease in the reflection of external light is not sufficient by only the color filters 30 and optimization of the resonant length.

In the organic EL device according to this embodiment, differences in characteristics among the light emitting elements 20 are considered, and the color filter 30 and the optical interference structure 83 are combined as is needed. In addition, by setting the optical distance, that is, the resonant length of the microcavity structure 88 in consideration of the degree of the decrease in the reflection of external light (not only the extraction efficiency), an organic EL device having the power consumption and the reflectivity of external light that are balanced with each other is acquired.

Figure 11:
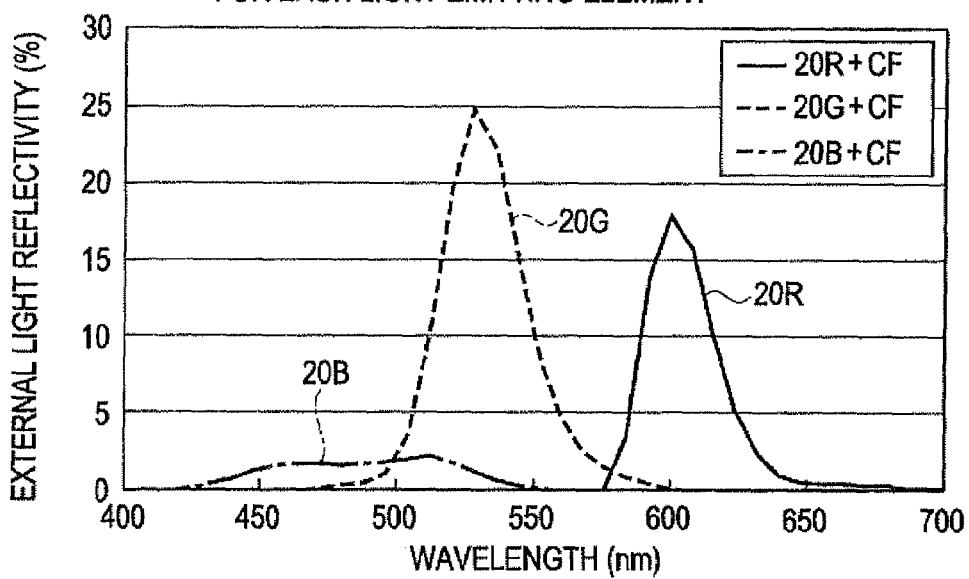
FIG. 11 is a diagram showing external light reflectivities of light emitting elements of an organic EL device according to Comparative Example 2.

In FIG. 11, the external light reflectivity of an organic EL device in which the resonant length is set by prioritizing the extraction efficiency is shown as Comparative Example 2. The organic EL device is configured by approximately the same constituent elements as those of the organic EL device shown in FIG. 8 or the organic EL device shown in FIG. 9. The layer thicknesses of the constituent elements are approximately the same as those of the organic EL device shown in FIG. 8 or the organic EL device shown in FIG. 9, except for the layer thickness of the anode 56. The layer thickness of the anode 56 is about 27 nm in the blue light emitting element 20B, about 64.8 nm in the green light emitting element 20G, and about 108 nm in the red light emitting element 20R. As described above, by changing the layer thickness of the anode 56, the resonant length of the microcavity structure 88 is set.

As shown in FIG. 11, among the light emitting elements 20 of three types included in the organic EL device in which the resonant length of the microcavity structure 88 is set by prioritizing the extraction efficiency, the external light reflectivity of the blue light emitting element 20B is in an allowable level. However, the external light reflectivities of the light emitting elements 20 of the other two colors (two types) are very high, and it can be supposed that the display quality in a bright place is in an unallowable level.

This result is caused by difficulties in decreasing the characteristics of the color filters 30, that is, reflection of external light having wavelengths in the wavelength range to be output by the light emitting elements 20. Thus, when the color filters 30 are used as means for decreasing the reflection of external light, the color filters 30 are needed to be used in combination of any other means. As described above, in the organic EL device according to this embodiment, the resonant length of the microcavity structure 88 is set with the decrease in reflection of external light focused, in addition to the color filter 30. In particular, by forming the optical interference structures 83 in the light emitting elements 20 of two types having high external light reflectivities, the decrease in reflection of external light and the decrease in the power consumption are implemented together.

TABLE 1

| | Configuration | Reflectivity of External Light (%) | Power Consumption |
|---|---|---|---|
| First Embodiment | optical interference structures are disposed in 20B and 20G | 1.39 | 1.151 |
| Second Embodiment | optical interference structure is disposed in 20G | 1.85 | 0.944 |
| Comparative Example 1 | optical interference structure is not included for all the light emitting elements and resonant length is optimized for suppressing reflectivity of external light | 2.61 | 1.000 |
| Comparative Example 2 | no optical interference structure is used and resonant length is optimized for improving extraction efficiency | 5.17 | 0.832 |
| Comparative Example 3 | optical interference structures are disposed in all the light emitting elements | 1.89 | 1.174 |

Table 1 shows results of measurements of the external light reflectivities and power consumption of the organic EL device according to the first embodiment and the organic EL devices according to the above-described comparative examples. The power consumption is relative power consumption for a case where the power consumption of the organic EL device according to Comparative Example 1 (third line of the table) is set to "1". Here, low power consumption represents high extraction efficiency. In addition, the reflectivity of external light is normal reflectance (for which correction for the spectral luminous efficacy is completed) on the front side.

The result of measurement represented in the first line is the result of measurement of the organic EL device according to this embodiment, that is, an organic EL device in which the length of the light path of the microcavity structure 88 is set with the decrease in reflection of external light focused and the optical interference structures 83 are formed in the blue light emitting element 20B and the green light emitting element 20G. The result of measurement represented in the second line is the result of measurement of an organic EL device according to a second embodiment of the invention, to be described later.

The result of measurement of Comparative Example 3 represented in the fifth line is the result of measurement of an organic EL device in which the optical interference structures 83 are formed in all the light emitting elements 20 of three types including the red light emitting element 20R. A difference between the external light reflectivities for a case where the optical interference structure 83 is formed in the red light emitting element 20R and a case where the optical interference structure 83 is not formed in the red light emitting element 20R is as shown in FIG. 7. The result of measurement of Comparative Example 2 shown in the fourth line are values of the organic EL device, in which the resonant length of the microcavity structure 88 is set by prioritizing the extraction efficiency shown in FIG. 11. The organic EL device according to this embodiment decreases the external light reflectivity to be in the lowest level while maintaining the power consumption at a relatively low level. Accordingly, it can be found that the decrease in the power consumption and the improvement of the display quality such as contrast in a bright place are implemented together at a high level.

Second Embodiment

Figure 12:
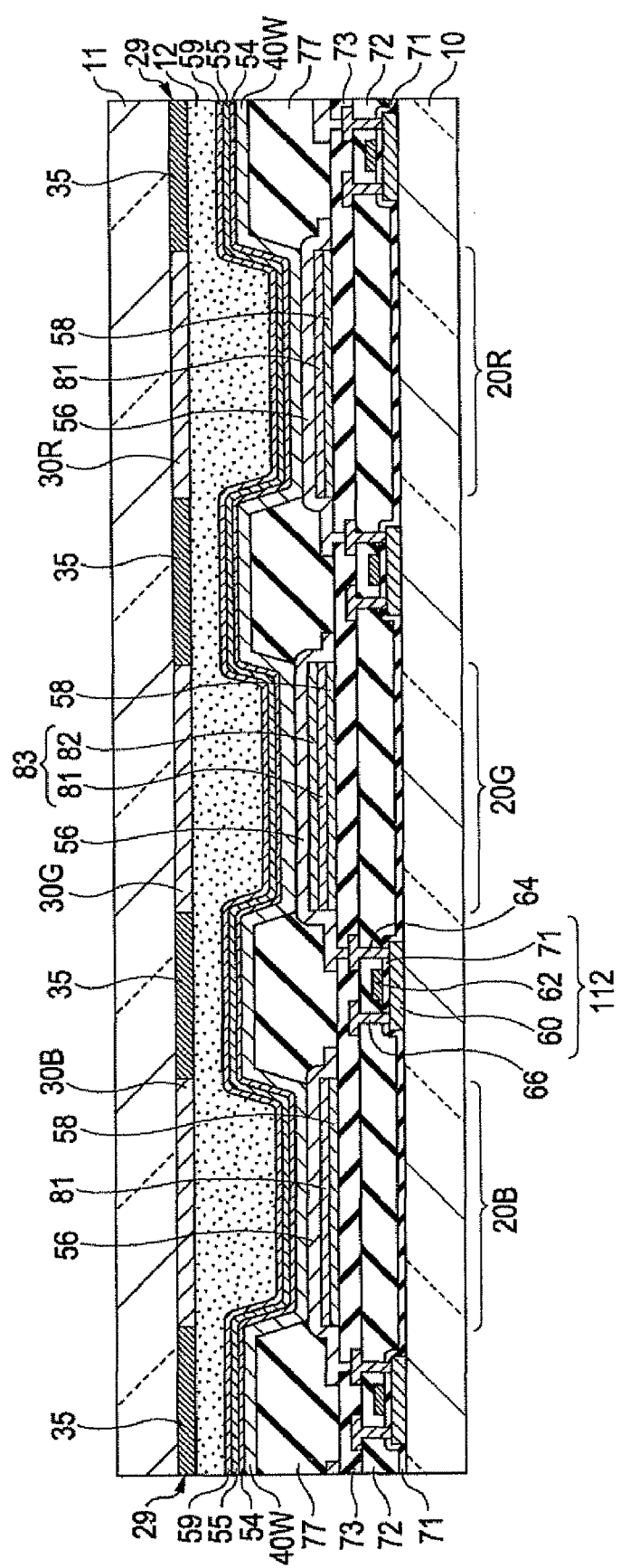
FIG. 12 is a schematic cross-sectional view of an organic EL device according to a second embodiment of the invention.

FIG. 12 is a schematic cross-sectional view of an organic EL device according to a second embodiment of the invention. The organic EL device according to this embodiment is a top emission type EL device in which light is output to the opposing substrate 11 side. The configuration of the organic EL device according to this embodiment is similar to that of the organic EL device according to the first embodiment. Thus, to each common constituent element, a same reference sign is assigned, and a description thereof is omitted here. The configuration difference between the organic EL devices according to the first and second embodiments is in two aspects including inclusion of the optical interference structure 83 and the configuration of the light emission and function layer 40. Among light emitting elements of three types, only a green light emitting element 20G has the optical interference structure 83. The light emission and function layer 40, as in the organic EL device according to the comparative example shown in FIG. 9, includes a white light emission and function layer 40W acquired from laminating a total of three layers including a layer using BD052 as a dopant, a layer using quinacridone as a dopant, and a layer using RD001 as a dopant which is common to the light emitting elements of three types.

In addition, regarding the layer thicknesses of constituent elements, the layer thicknesses of the transparent layer 81 and the semi-reflective layer 82 that constitute the optical interference structure 83 and the layer thickness of the ITO forming the anode 56 as the first electrode are different from those of the organic EL device according to the first embodiment. In particular, the transparent 81 is formed of silicon nitride having a layer thickness of about 90 nm, and the semi-reflective layer 82 is formed of titanium having a layer thickness of about 15 nm. In addition, the layer thickness of the anode 56 is about 32.4 nm in the blue light emitting element 20B and about 21.6 nm in the green light emitting element 20G. In addition, the layer thickness of the anode 56 in the red light emitting element 20R is about 92 nm that is approximately the same as that of the organic EL device according to the first embodiment. The materials, layer thicknesses, and the like of other constituent elements are the same as those of the organic EL device according to the first embodiment.

Figure 13:
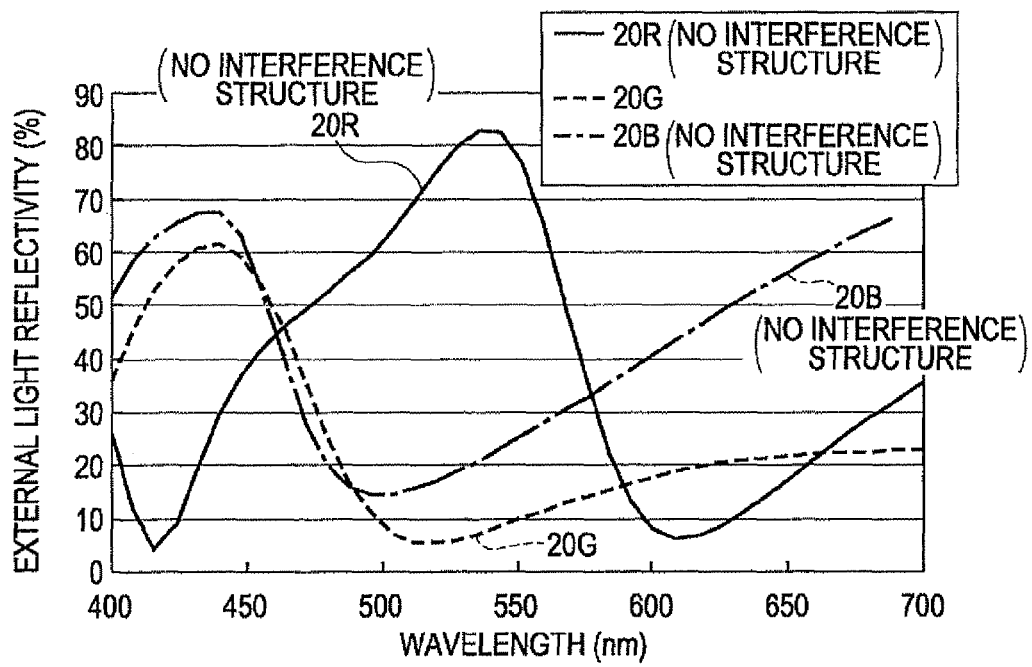
FIG. 13 is a diagram showing external light reflectivities of light emitting elements for a case where color filters are excluded from the organic EL device according to the second embodiment.
Figure 14:
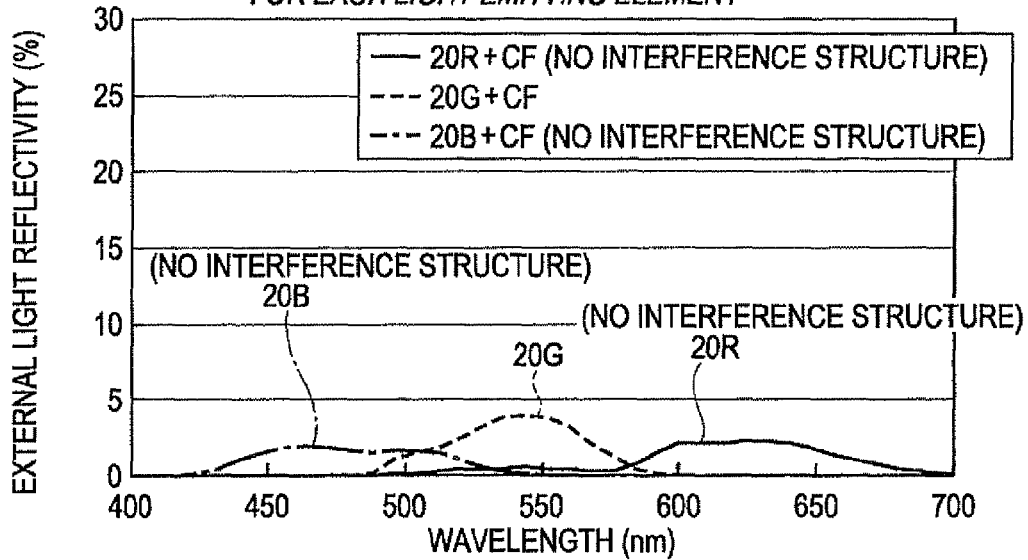
FIG. 14 is a diagram showing external light reflectivities of light emitting elements of the organic EL device according to the second embodiment.

The external light reflectivities of light emitting elements 20 configuring the organic EL device according to this embodiment are shown in FIG. 14. In addition, FIG. 13 shows the external light reflectivities of the light emitting elements 20 for a case where the color filters 30 are excluded from the organic EL device according to the second embodiment as a comparative example.

As shown in FIG. 13, when the color filter 30 is excluded, the reflectivity of external light having a wavelength range which is transmitted though the color filter 30 becomes too high, and accordingly, the organic EL device is not practical. This is also attributed to setting the resonant length of the microcavity structure 88 on the premise of inclusion of the color filter 30. However, it can be checked that the decrease in the reflectivity of external light is incomplete even in a case where setting of the resonant length is primarily focused on the decrease in the reflectivity of external light and the optical interference structure 83 is formed in the green light emitting element 20G. On the other hand, as shown in FIG. 14, when the color filter 30 is disposed, the reflectivities of all the light emitting elements 20 of three types are suppressed to be a low level.

The external light reflectivity and power consumption level of the organic EL device according to this embodiment are as shown in the second line of Table 1. Although the reflectivity of external light is slightly higher than that of the organic EL device according to the first embodiment, it has a level equivalent to the case where the optical interference structures 83 are formed in all the light emitting elements which is written in the fifth line of Table 1 as Comparative Example 3. On the other hand, the power consumption of the organic EL device has a second smallest value among the organic EL devices of five types including comparative examples, and it can be found that the extraction efficiency is improved. Accordingly, the organic EL device according to this embodiment improves the extraction efficiency while decreasing the reflectivity of external light to an allowed level. As a result, the organic EL device according to this embodiment, as the organic EL device according to the first embodiment, implements a decrease in power consumption and improvement of the display quality in a bright place together at a high level.

Third Embodiment

Figure 15:
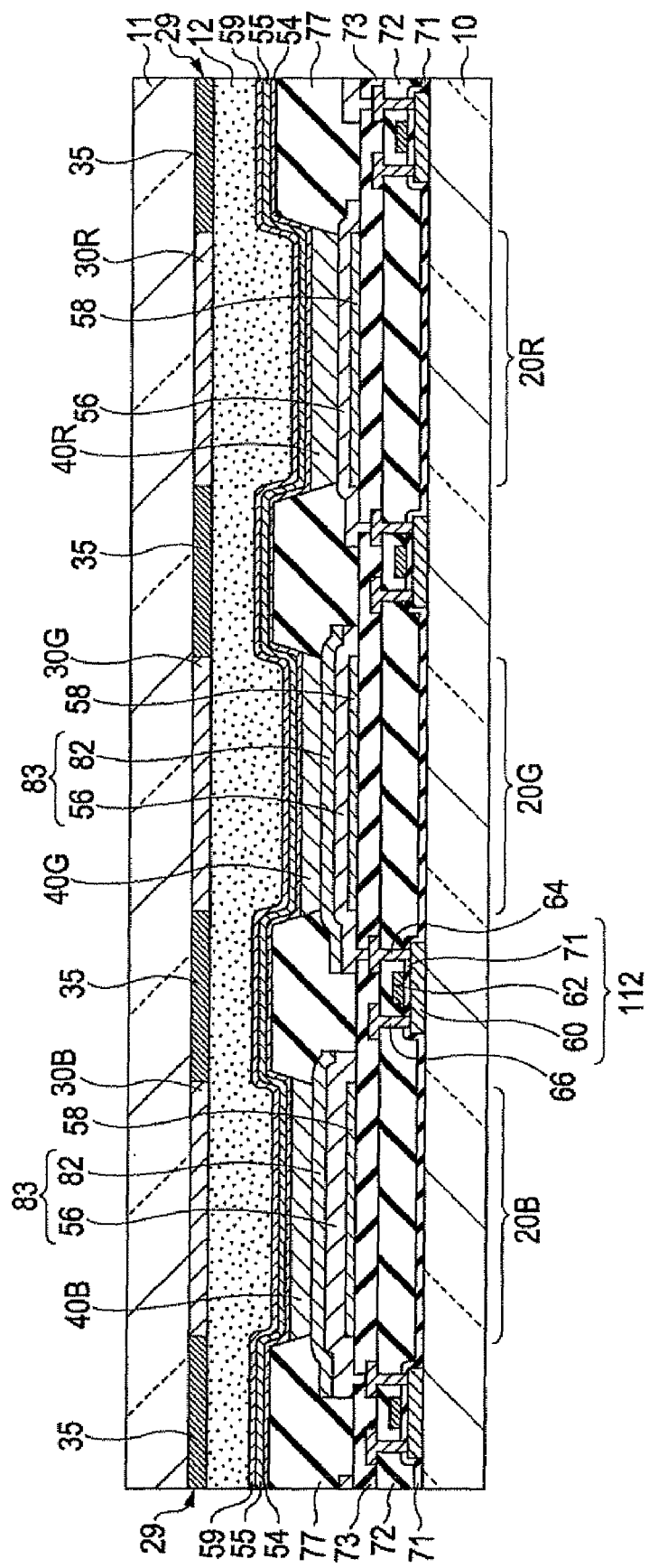
FIG. 15 is a schematic cross-sectional view of an organic EL device according to a third embodiment of the invention.

FIG. 15 is a schematic cross-sectional view of an organic EL device according to a third embodiment of the invention. The organic EL device according to this embodiment is a top emission type EL device in which light is output to the opposing substrate 11 side. The configuration of the organic EL device according to this embodiment is similar to that of the organic EL device according to the first embodiment. As the light emission and function layers 40, the blue light emission and function layer 40B, the green light emission and function layer 40G, and the red light emission and function layer 40R are individually formed in the blue light emitting element 20B, the green light emitting element 20G, and the red light emitting element 20R. In addition, the optical interference structures 83 are formed in the blue light emitting element 20B and the green light emitting element 20G. To each common constituent element, a same reference sign is assigned, and a description thereof is omitted here.

The difference between the organic EL devices according to the first and third embodiments is the configuration of the optical interference structure 83. In the organic EL device according to this embodiment, the transparent layer 81 is not included, and the anode 56 as the first electrode, the semi-reflective layer 82, and the optical interference structure 83 are formed. As shown in the figure, on faces of anodes 56 of the blue light emitting element 20B and the green light emitting element 20G which are located on the opposing substrate 11 side, the semi-reflective layer 82 is formed.

As described above, since the anode 56 is formed of ITO that is a transparent conductive material, the anode 56 can perform a function that is the same as that of the transparent layer 81 of the organic EL device according to the first embodiment, that is, a function for adjusting the optical distance between the surface (the boundary surface between the semi-reflective layer 82 and the light emission and function layer 40) of the semi-reflective layer 82 and the surface of the reflective layer 58 (the boundary surface between the reflective layer 58 and the anode 56), in addition to a function as an electrode. Accordingly, by forming the semi-reflective layer 82 on the face of the anode 56 on the opposing substrate 11 side as described above, the optical interference structure 83 can be formed between the reflective layer 58 and the light emission and function layer 40 such as the green light emission and function layer 40G without forming the transparent layer 81 (see FIG. 2).

The optical interference structure 83 sets the above-described optical distance (of the laminated body of the anode 56 and the semi-reflective layer 82) to be about a quarter of the wavelength of light for which the reflection of external light is desired to decrease, and accordingly, can decrease the reflection of external light, as the optical interference structure 83 according to the first embodiment. In other words, by reflecting about 50% of light that is transmitted through the color filter 30 and reaches the semi-reflective layer 82 from the surface (the boundary surface between the semi-reflective layer 82 and the light emission and function layer 40) of the semi-reflective layer 82 and reflecting the remaining about 50% of the light from the surface (the boundary surface between the reflective layer 58 and the anode 56) of the reflective layer 58, the phases of reflected light are deviated by 180 degrees to be offset. Accordingly, while the organic EL device according to this embodiment has the display quality in a bright place which is equivalent to that of the organic EL device according to the first embodiment, it can reduce the manufacturing cost by decreasing a thin film forming process and a patterning process for the thin film.

In addition, the layer thickness of the anode 56 of the organic EL device according to this embodiment is about 213 nm in the blue light emitting element 20B, about 111 nm in the green light emitting element 20G, and about 175 nm in the red light emitting element 20R. It is preferable that the display quality of the organic EL device is improved on the whole, including the effect of the decrease in the reflectivity of external light that is achieved by optimizing the resonant distance of the above-described microcavity structure 88, by adjusting the above-described values in accordance with the layer thickness of the light emission and function layer 40 or the index of refraction.

Fourth Embodiment

Figure 16:
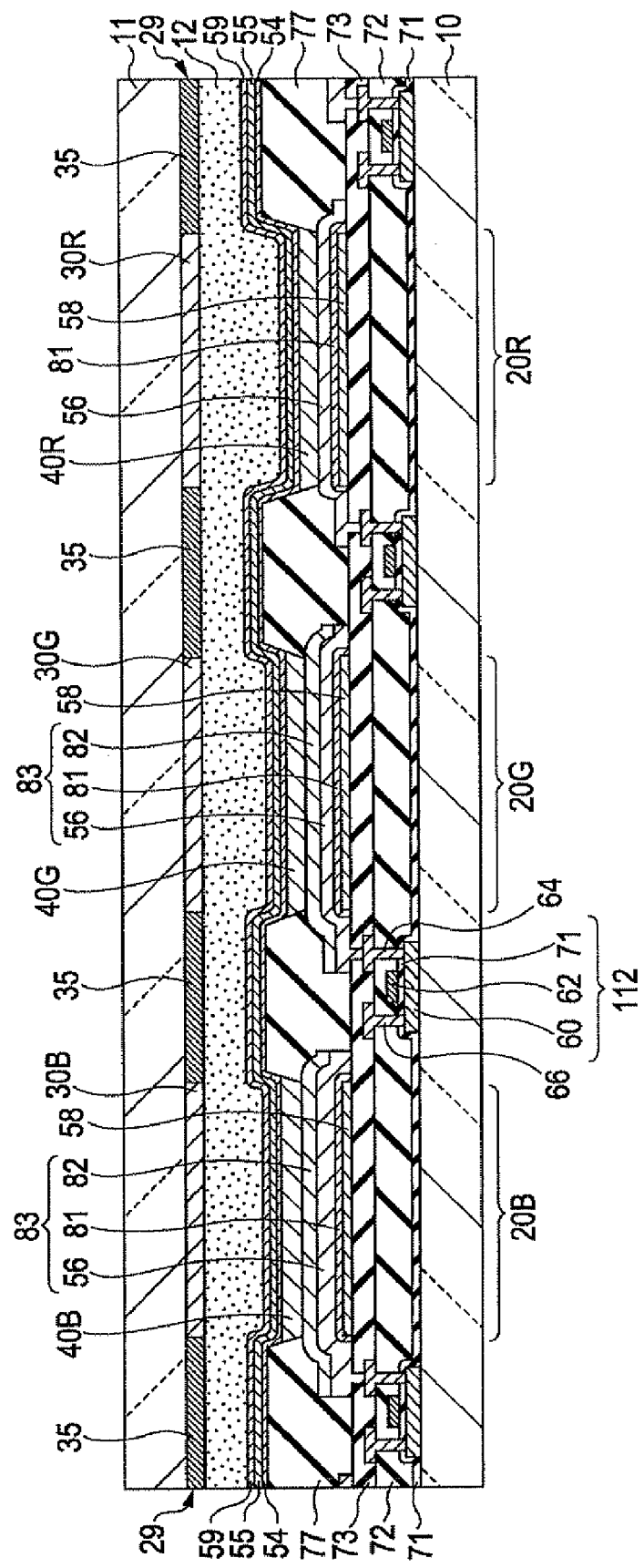
FIG. 16 is a schematic cross-sectional view of an organic EL device according to a fourth embodiment of the invention.

FIG. 16 is a schematic cross-sectional view of an organic EL device according to a fourth embodiment of the invention. The organic EL device according to this embodiment is a top emission type EL device in which light is output to the opposing substrate 11 side. To each constituent element of the organic EL device according to the fourth embodiment which is common to the organic EL device according to the first or third embodiment, a same reference sign is assigned, and a description thereof is omitted here. In addition, the common constituent element is formed of a same material, unless described otherwise.

In the organic EL device according to this embodiment, the light emission and function layers 40 are individually formed in the light emitting elements 20 of three types and the optical interference structures 83 are formed in the blue light emitting element 20B and the green light emitting element 20G, which is the same as in the organic EL device according to the above-described third embodiment. In addition, in the organic EL device according to this embodiment, the semi-reflective layer 82 is formed on a side of the anode 56 which is located on the opposing substrate 11 side, which is the same as in the organic EL device according to the third embodiment.

The difference between the organic EL devices according to the third embodiment and the fourth embodiment is that the transparent layer 81 is formed between the anode 56 and the reflective layer 58 in the organic EL device according to the fourth embodiment. In the organic EL device according to the this embodiment, the optical interference structure 83 is configured by the transparent layer 81, the anode 56, and the semi-reflective layer 82 that are formed on a side of the reflective layer 58 which is located on the opposing substrate 11 side in the described order. In other words, in the organic EL device according to this embodiment, a laminated body of the transparent layer 81 and the anode 56 performs the function of the transparent layer 81 of the organic EL device according to the first embodiment.

As described above, in the organic EL device according to the first embodiment, a total of three layers of the transparent layer 91, the semi-reflective layer 82, and the anode 56 are formed between the reflective layer 58 and the light emission and function layer 40. In the organic EL device according to this embodiment, similarly, the above-described three layers are formed. By forming the transparent layer 81 between the semi-reflective layer 58 and the anode 56, the layer thickness of the transparent layer 81 can decrease. Accordingly, a time required for forming a thin film and patterning the thin film can decrease. In addition, a phenomenon of electric corrosion that can occur between the reflective layer 58 and the anode 56 can be suppressed.

Fifth Embodiment

Figure 17:
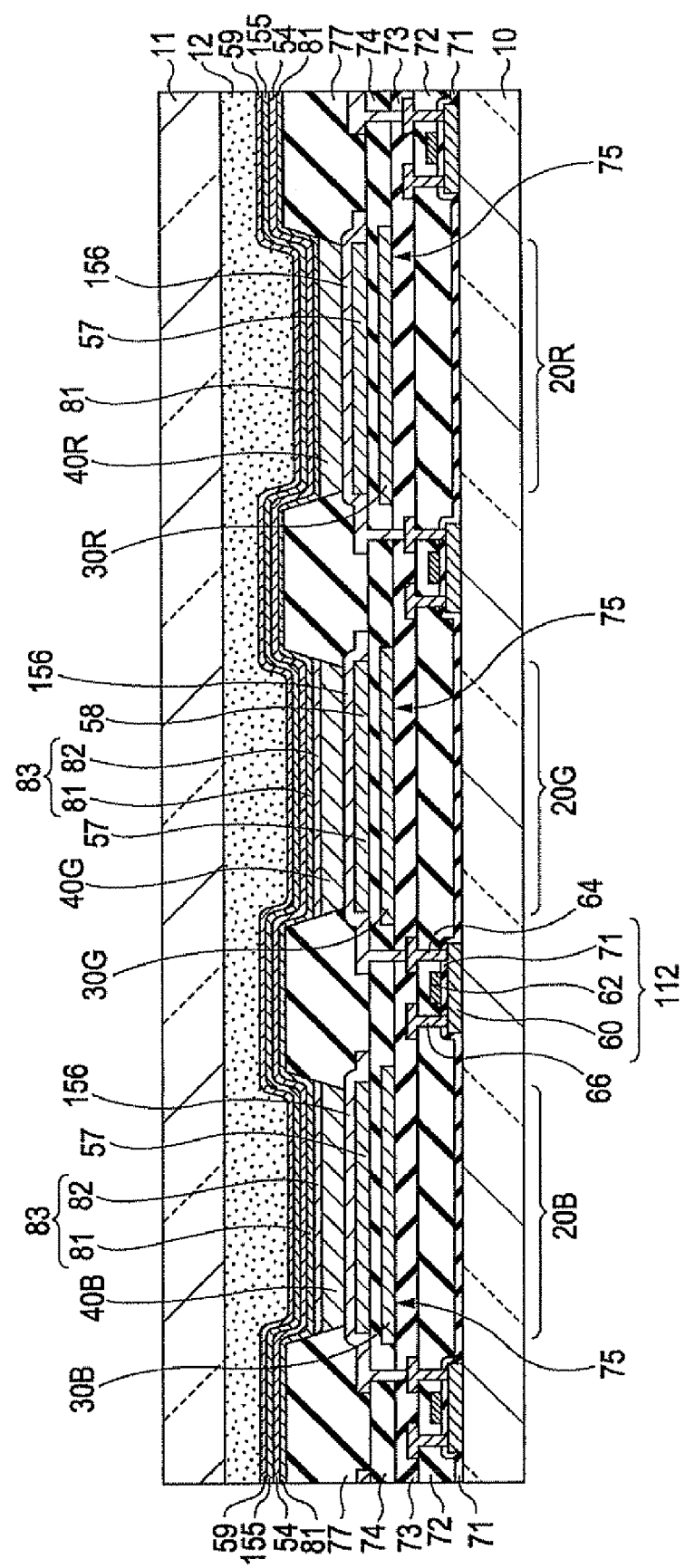
FIG. 17 is a schematic cross-sectional view of an organic EL device according to a fifth embodiment of the invention.

FIG. 17 is a schematic cross-sectional view of an organic EL device according to a fifth embodiment of the invention. The organic EL device according to this embodiment, differently from the organic EL devices according to the above-described first to fourth embodiments, is a bottom emission type EL device in which light is output to the component substrate 10 side. Accordingly, to be described later, a cathode 155 is the first electrode, an anode 156 is the second electrode, and the optical interference structure 83 is formed between the cathode 155 and the light emission and function layer 40. The component substrate 10 is formed of a transparent material.

To each constituent element, except for one pair of the above-described electrodes, of the organic EL device according to this embodiment that is common to a constituent element of the organic EL device according to the first embodiment, a same reference sign is assigned. Hereinafter, a difference between the organic EL devices according to the first and fifth embodiments will be primarily focused, and a description of common aspects is omitted here.

In the organic EL device according to this embodiment, the color filter 30 is formed on the component substrate 10 side in accordance with the direction of output of light. In particular, a total of three color filters 30 including the blue color filter 30B, the green color filter 30G, and the red color filter 30R are formed on a face of the second interlayer insulating layer 73 which is located on the opposing substrate 11 side, that is, the boundary surface between the second interlayer insulating layer 73 and a third interlayer insulating layer 74 in correspondence with the light emitting elements 20. The light generated inside the light emission and function layer 40 is transmitted though the color filter 30 and is output from the component substrate 10 side, and thus the boundary surface between the color filter 30 and the second interlayer insulating layer 73 is defined as the display surface 75.

The black matrix 35 (see FIG. 2) is not formed, and the driving TFTs 112 and the scanning line 102, the signal line 104, and the like (see FIG. 1) that are formed between the driving TFTs 112 perform a function for shielding light for each pixel area.

As the light emission and function layers 40, as in the organic EL device according to the first embodiment, the blue light emission and function layer 40B, the green light emission and function layer 40G, and the red light emission and function layer 40R are individually formed in the blue light emitting element 20B, the green light emitting element 20G, and the red light emitting element 20R. The configuration of the light emission and function layer 40 and forming materials of layers are the same as those of the organic EL device according to the first embodiment.

The organic EL device according to this embodiment, as the organic EL devices according to the above-described first to fourth embodiments, includes the microcavity structure 88 (see FIG. 3). The cathode 155 as the first electrode is formed of Al having a layer thickness of about 100 nm and also serves as a reflective layer. The cathode reflects light, which progresses toward the opposing substrate 11 side, of the light generated in the light emission and function layer 40 to be described later to the component substrate 10 side.

The anode 156 as the second electrode is formed of ITO. In addition, a second semi-reflective layer 57 is formed in the anode on the component substrate 10 side. The second semi-reflective layer 57 is formed of Al having a layer thickness of about 8 nm. The second semi-reflective layer 57 reflects about 50% of light that is generated in the light emission and function layer 40 and light reflected from the cathode 155 and transmits the remaining 50% of the light to be output from the display surface 75. Accordingly, a microcavity structure is formed between the cathode 155 and the second semi-reflective layer 57. By adjusting the length of the light path of the microcavity structure, reflection of external light can decrease. In addition, a protection layer formed of silicon nitride or the like may be formed between the cathode 155 and the second semi-reflective layer 57.

The organic EL device according to this embodiment, as the organic EL device according to the first embodiment, the optical interference structures 83 are formed in the blue light emitting element 20B and the green light emitting element 20G. Since the organic EL device according to this embodiment is the bottom emission type, as described above, the optical interference structure 83 is formed between the cathode 155 also serving as the reflective layer and the light emission and function layer 40.

On the opposing substrate 11 side of the blue light emission and function layer 40B and the opposing substrate 11 side of the green light emission and function layer 40G, the semi-reflective layer 82 formed of titanium is formed. In addition, the transparent layer 81 is formed over all the entire area of the display area 100 (see FIG. 1) on the opposing substrate 11 side of the semi-reflective layer. The transparent layer is formed of ITO that is a transparent conductive material, and conductivity between the cathode 155 and the anode 156, that is, conductivity from the cathode 155 through the light emission and function layer 40 to the anode 156 is acquired. Under such a configuration, between the cathodes 155 of the blue light emitting element 20B and the green light emitting element 20G and the light emission and function layer 40, the optical interference structure 83 constituted by the transparent layer 81 and the semi-reflective layer 82 through the electron injecting layer 54 is formed. The optical interference structure 83 may be considered to be constituted by a total of three layers including the electron injecting layer 54, the transparent layer 81, and the semi-reflective layer 82.

The optical interference structure performs a same function as that of the optical interference structure 83 included in the organic EL device according to the first embodiment shown in FIG. 3. In other words, by dividing the external light that has been transmitted through the color filter 30 and the anode 156 and reached the boundary surface between the light emission and function layer 40 and the semi-reflective layer 82 into two including light reflected from the surface (the boundary surface of the light emission and function layer 40 and the semi-reflective layer 82) of the semi-reflective layer 82 and light reflected from the surface (the boundary surface between the cathode 155 and the electron injecting layer 54) of the cathode 155 so as to be offset, the reflectivity of the external light can be decreased.

In the organic EL device according to this embodiment, the optical interference structure 83 is formed on the cathode 155 side in accordance with the direction of output of light, and accordingly, about 50% of emission light generated in the light emission and function layer 40 is output from the display surface 75 without being influenced by the optical interference structure. As a result, the reflectivity of external light can decrease while a decrease in the extraction efficiency is suppressed.

Modified Example 1

In the organic EL device according to the above-described first embodiment, the length of the light path of the optical interference structure 83 is set to be the same for the blue light emitting element 20B and the green light emitting element 20G. However, the lengths of the light paths in the light emitting elements are not needed to be the same. Since the wavelength range of external light (the second external light component 92) that is transmitted through the color filter differs for each light emitting element 20, and thus, the length of the light path may be set in accordance with the difference for each light emitting element 20. By performing the thin film forming process (and the thin film patterning process and the like) one more time, the optical interference structures 83 having different lengths of the light paths can be formed in the blue light emitting element 20B and the green light emitting element 200.

Modified Example 2

The organic EL devices according to the above-described first to fifth embodiments have the light emitting elements 20 of three types and form a color image by mixing light of three primary colors including blue, green, and red. However, the types of the emission light is not limited thereto. Thus, for example, an additional light emitting element that outputs white light may be included in addition to the light emitting elements that output three primary colors.

What is claimed is:

1. A light emitting device comprising a first light emitting element and a second light emitting element above a substrate,
the first light emitting element and the second light emitting element each including:
a first electrode above the substrate;
a second electrode having transparency or semi-transmissive reflectivity;
a light emitting layer disposed between the first electrode and the second electrode;
a reflective layer that reflects light emitted by the light emitting layer to the second electrode side and is disposed between the substrate and the first electrode; and
a color filter that absorbs light having wavelengths in a wavelength range other than a wavelength range of the output light and is disposed above the second electrode, and
the first light emitting element having a semi-reflective layer that is disposed between the reflective layer and the first electrode and a transparent layer that is disposed between the reflective layer and the semi-reflective layer, the second light emitting element having the transparent layer but not having the semi-reflective layer, the transparent layer being formed of a same material in each of the first and second light emitting elements; and
a microcavity structure being formed in each of the first and second light emitting elements.

2. The light emitting device according to claim 1, wherein the first electrode is formed of a transparent conductive material.

3. The light emitting device according to claim 1, wherein the first light emitting element is a green light emitting element that emits green light.

4. The light emitting device according to claim 1, wherein the second light emitting element is a red light emitting element that emits red light.

5. The light emitting device according to claim 1, wherein the transparent layer includes a transparent insulating material layer and a transparent conductive material layer that is disposed between the transparent insulating material layer and the second electrode.

6. A light emitting device comprising a first light emitting element and a second light emitting element above a substrate,
the first light emitting element and the second light emitting element each including:
a first electrode above the substrate;
a second electrode having transparency or semi-transmissive reflectivity;
a light emitting layer disposed between the first electrode and the second electrode;
a reflective layer that reflects light emitted by the light emitting layer to the second electrode side and is disposed between the substrate and the first electrode; and
a color filter that absorbs light having wavelengths in a wavelength range other than a wavelength range of the output light and is disposed above the second electrode,
the first light emitting element having a semi-reflective layer that is disposed between the first electrode and the light emitting layer, the semi-reflective layer being a separate layer from the first electrode, the second light emitting element not having the semi-reflective layer; and
a microcavity structure being formed in each of the first and second light emitting elements.

7. A light emitting device comprising a first light emitting element and a second light emitting element above a substrate,
the first light emitting element and the second light emitting element each including:
a first electrode having transparency and disposed above the substrate;
a second electrode having reflectivity;
a light emitting layer disposed between the first electrode and the second electrode; and a color filter that absorbs light having wavelengths in a wavelength range other than a wavelength range of the output light and is disposed between the substrate and the first electrode, the first light emitting element having a first semi-reflective layer that is disposed between the first electrode and the color filter, a second semi-reflective layer that is disposed between the light emitting layer and the second electrode, the second semi-reflective layer being a separate layer from the second electrode, and a transparent layer that is disposed between the second electrode and the second semi-reflective layer, the second light emitting element not having the first semi-reflective layer and the second semi-reflective layer; and a microcavity structure being formed in each of the first and second light emitting elements.

8. The light emitting device according to claim 7,
wherein the transparent layer is formed of a conductive material and serves as the second electrode additionally.

* * * * *